US011209482B1

(12) United States Patent
Sharma et al.

(10) Patent No.: US 11,209,482 B1
(45) Date of Patent: Dec. 28, 2021

(54) METHODS AND DEVICES FOR TESTING COMPARATORS

(71) Applicant: STMicroelectronics International NV, Plan-les-Ouates (CH)

(72) Inventors: Vivek Mohan Sharma, New Delhi (IN); Deepak Baranwal, Greater Noida (IN); Amulya Pandey, Greater Noida (IN)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 0 days.

(21) Appl. No.: 17/107,370

(22) Filed: Nov. 30, 2020

(51) Int. Cl.
*G01R 31/28* (2006.01)
*G01R 31/317* (2006.01)
*G01R 31/3193* (2006.01)
*G06F 11/22* (2006.01)

(52) U.S. Cl.
CPC ... *G01R 31/31703* (2013.01); *G01R 31/3193* (2013.01); *G01R 31/31713* (2013.01); *G01R 31/31724* (2013.01); *G06F 11/2215* (2013.01)

(58) Field of Classification Search
CPC ........ G01R 31/31703; G01R 31/31713; G01R 31/31724; G01R 31/3193; G06F 11/2215; G06F 11/2247; H03M 13/01
See application file for complete search history.

(56) References Cited

U.S. PATENT DOCUMENTS

| 6,799,287 B1* | 9/2004 | Sharma | H03M 13/47 714/703 |
| 6,829,728 B2 | 12/2004 | Cheng et al. | |
| 2013/0139008 A1* | 5/2013 | Kalyanasundharam | G06F 11/1064 714/703 |
| 2014/0236524 A1* | 8/2014 | Frediani | G01R 31/2834 702/108 |

FOREIGN PATENT DOCUMENTS

WO 2018118837 A1 6/2018

OTHER PUBLICATIONS

Steininger, Andreas et al., "Built-in Fault Injectors—The Logical Continuation of BIST"?, Embedded Computing Systems Group, Vienna University of Technology, Jan. 2003, 10 pages, Vienna, Austria.

* cited by examiner

*Primary Examiner* — Christine T. Tu
(74) *Attorney, Agent, or Firm* — Slater Matsil, LLP

(57) ABSTRACT

A device for a system on a chip (SOC), the device includes: a comparator that includes a first input port, a second input port, and an output port. A first input signal and a second input signal are split into N bit pairs that include one bit from the first input signal and one bit from the second input signal. The comparator is configured so a mismatch between the first input signal and the second input signal causes an output signal to assume a first expected state. The device further comprises a test controller to perform a first operability test (Continued)

by mismatching the N bit pairs and verifying that the output signal assumes the first expected state.

28 Claims, 14 Drawing Sheets

METHODS AND DEVICES FOR TESTING COMPARATORS

TECHNICAL FIELD

The present invention relates to methods and devices for testing comparators.

BACKGROUND

Comparators frequently play important roles for testing and verifying that component parts for various machines and devices are operating correctly. In many applications, health and safety considerations for users may depend on reliable operation of one or more comparators. But, the comparators themselves may develop errors. It may be advantageous to test comparator operation with a Built-in Self Test (BIST) to detect errors in a comparator and prevent them from impacting, or verifying, the functionality of a device. Such a BIST may also test for self-faults.

SUMMARY

In accordance with an embodiment of the present invention a built-in self-test device for a system on a chip (SOC) including a comparator disposed on the SOC the comparator comprising; a first input port to receive a first input signal; a second input port to receive a second input signal; an output port to produce an output signal; and wherein the first input signal and the second input signal are split into N bit pairs each bit pair including one bit from the first input signal and one bit from the second input signal; and wherein the comparator is configured so a mismatch between the first input signal and the second input signal causes the output signal to comprise a first expected state. The built-in self-test device on the SOC further includes a test controller disposed on the SOC and coupled with the first input port, the second input port, and the output port, the test controller being configured to perform a first operability test by generating a mismatch for each of the N bit pairs and verifying that the output signal includes the first expected state in response to the mismatch for each of the N bit pairs.

In accordance with an embodiment of the present invention a system for testing operation of a comparator, the comparator includes a first input port configured to receive N bits, a second input port configured to receive N bits, wherein the N bits of the second input port and the N bits of the first input port are split into N bit pairs, and an output port configured to produce an output signal having a first expected state when any of the N bit pairs are mismatched. The system further including a first circuit configured to produce a first signal comprising N bits; a second circuit configured to produce a second signal comprising N bits; a test controller configured to produce a test-enable signal; a selection circuit coupled to the first circuit, the second circuit, and the test controller, the selection circuit being configured to: pass the first signal to the first input port, and pass the second signal to the second input port when the test-enable signal is in a first state, and pass a first test signal from the test controller to the first input port, and pass a second test signal from the test controller to the second input port when the test-enable signal is in a second state; and wherein the test controller is configured to perform an operability test on the comparator by setting the test-enable signal to the second state and varying the first test signal, the second test signal, or both to mismatch the N bit pairs.

In accordance with an embodiment of the present invention a method to test operations of a comparator on a system on a chip (SOC) includes: receiving, by a test controller disposed on the SOC, an initialization signal; using the test controller to match a first signal received by the comparator with a second signal received by the comparator; checking that an output signal from the comparator comprises an expected output for matching inputs; using the test controller to mismatch the first signal received by the comparator and the second signal received by the comparator; and checking that the output signal comprises an expected output for mismatched inputs.

In accordance with an embodiment of the present invention a system for testing operation of comparators includes a plurality of comparators, each comparator including; a first input port configured to receive N bits; a second input port configured to receive N bits; wherein the N bits of the second input port and the N bits of the first input port are split into N bit pairs; and an output port configured to produce an output signal having a first expected state when any of the N bit pairs are mismatched. In accordance with an embodiment the system further includes a first circuit configured to deliver a first signal comprising N bits to the first input port of each comparator of the plurality of comparators; a second circuit configured to deliver a second signal to the second input port of each comparator of the plurality of comparators; and wherein a test controller is configured to perform an operability test by instructing the first circuit, the second circuit, or both to mismatch the N bit pairs of each comparator of the plurality of comparators.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Comparators may serve many important roles on many different types of devices across many applications including, but not limited to, automotive, aerospace and industrial applications. In many cases, comparators may be used for tasks that implicate safety considerations. Accordingly, it is advantageous to have reliable comparators and reliable means to check the operation of comparators.

Redundancy checkers provide one example of systems that incorporate comparators. A redundant system may provide a backup system to check the operation of a functional system for a device.

Figure 1:
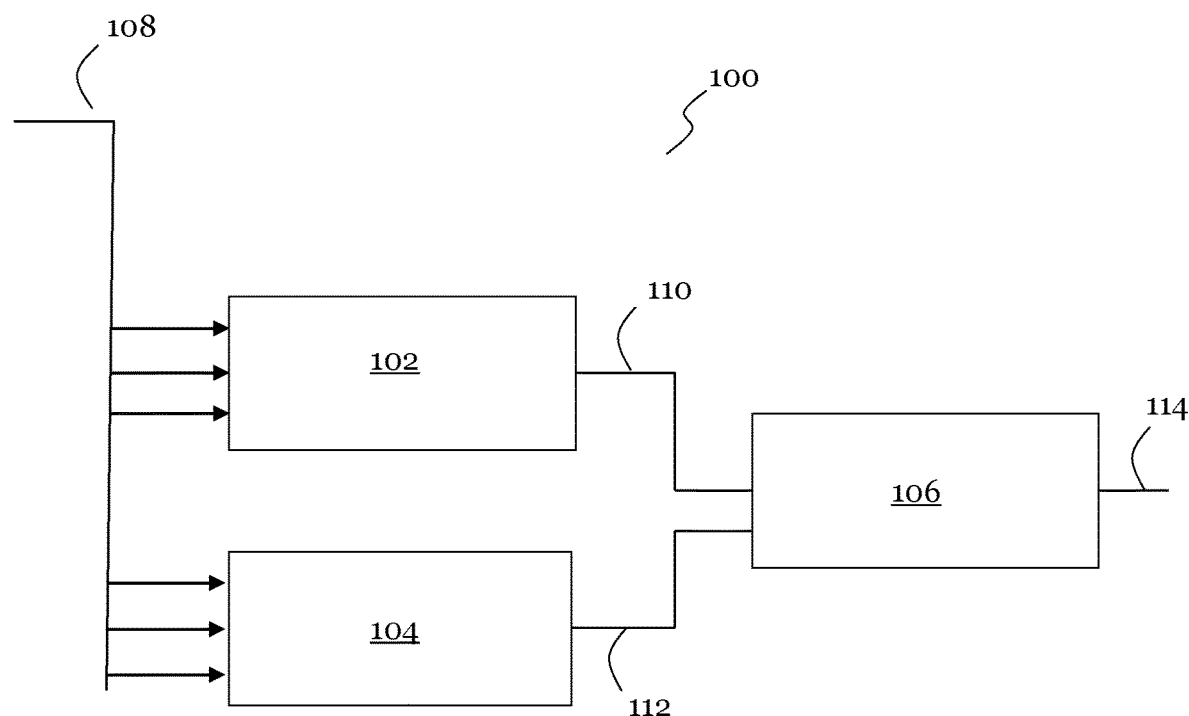
FIG. 1 depicts a comparator-based redundant system in accordance with an embodiment.

FIG. 1 depicts a comparator-based redundant system 100.

The comparator-based redundant system of claim 1 may comprise a functional circuit 102, and a redundant circuit 104. The functional circuit 102 may receive inputs 108 to perform a function and generate an output 110. The redundant circuit 104 may be used to test the performance of the functional circuit 102. The redundant circuit 104 may be configured to dummy the response of the functional circuit. The redundant circuit 104 may receive the same input 108 as the functional circuit 104. If the system 100 is operating properly, the redundant circuit 104 will generate output 112 that is identical to the output 110 generated by functional circuit 102.

To check that the comparator-based redundant system 100 is operating properly, the output 110 generated by the functional circuit 102 and the output 112 generated by the redundant circuit 104 are both sent to a comparator 106. The comparator 106 will then compare the output 110 generated by the functional circuit 102 and the output 112 generated by the redundant circuit 104. The comparator 106 is configured to produce an output 114 having a first state if the output 110 generated by the functional circuit 102 and the output 112 generated by the redundant circuit 104 are the same, and comprise a different state if they are different. The output 114 may also be coupled with an error collector (not shown) that is notified by the output 114 when a discrepancy between signals occurs.

A comparator-based redundant system 100 may be utilized for critical safety elements. The redundancy may allow errors to be spotted and appropriate action to be taken. This may be especially important when the comparator-based redundant system 100 is used in a system that has health and safety implications.

Comparators may also be used to detect new information. Data stored in a memory may be compared with a potential new data set to determine if the new data set is unique. In various embodiments, if the new data is different than any preexisting data, the new data set may be saved to the memory.

Figure 2:
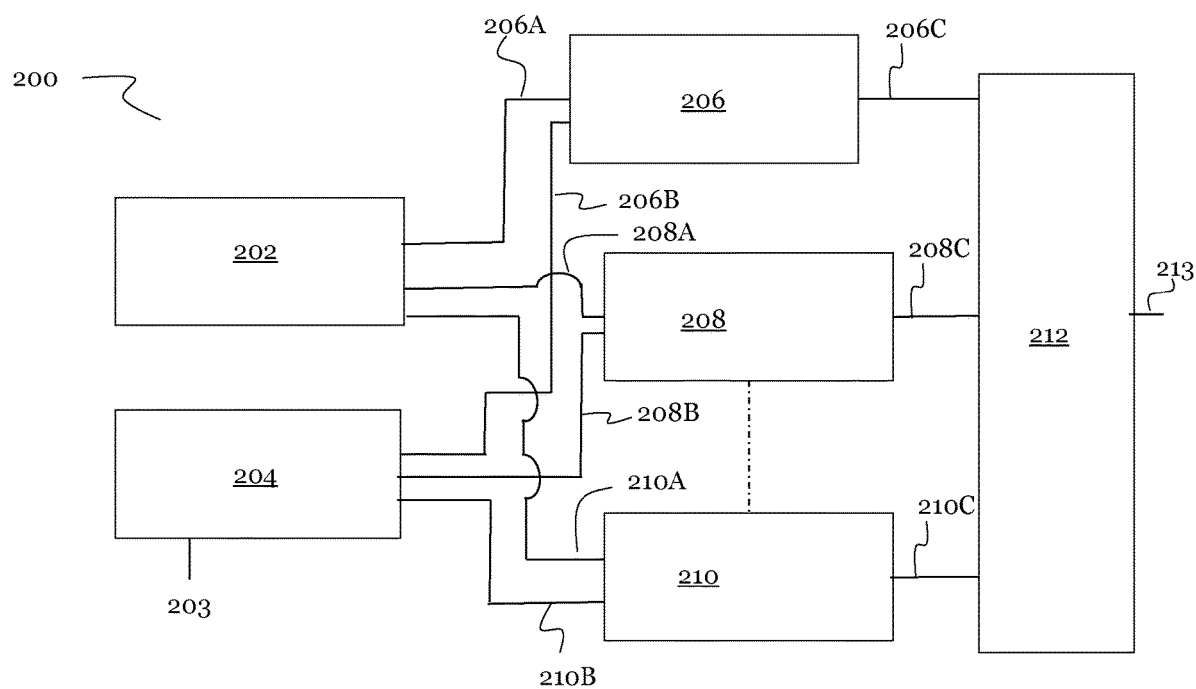
FIG. 2. Illustrates a memory-management system in accordance with an embodiment.

FIG. 2. Illustrates a memory-management system 200.

A memory-management system 200 may comprise a memory-storage circuit 202. In various embodiments, the memory-storage circuit 202 may store existing data sets. The memory-management system 200 may also receive a new data set at an input 203. The memory-storage circuit 202 may comprise a plurality of locations to store data sets. For example, the memory-storage circuit may comprise 128 locations wherein each location may store a 49-bit data set. The data sets may comprise error packets that comprise information about the location of an error within a system. The data set may also include additional information about the characteristics of the error, for example, the size (single bit, double bit, etc.) of an error.

In various embodiments, a new data set may be delivered to a buffer circuit 204. It may be advantageous to compare the new data set with the existing data sets already stored in the memory-storage circuit 202. In various embodiments, the buffer circuit 204 may store arbitrated and synchronized data. Each of the locations of the memory-storage circuit 202 may need to be searched to confirm whether the new data set is unique.

The memory-management system 200 may comprise one or more comparators to effect a comparison between the data sets being stored in the memory-storage circuit 202 and a new data set. The number of comparators in the memory-storage system may correspond to the number of data-set locations in the memory-storage device. For example, if there are 128 locations to store data sets, the memory-storage system, in various embodiments, may comprise 128 comparators: one comparator for each data-set location. In various embodiments, the number of comparators may differ from the number of data-set locations. For example, there may be 64 comparators that perform data-set comparisons sequentially in the first sixty-four data-set locations and then in the next sixty-four data-set locations.

A first comparator 206 may receive a first input signal 206A from the memory-storage circuit 202 and a second input signal 206B from the buffer circuit 204. During normal operation, the first input signal 206A received by the first comparator 206 may correspond to a first data set stored in the memory-storage circuit 202. And, the second input signal 206B received by the first comparator 206 may convey the new data set received by the memory-management system 200 during normal operation of the memory-management system 200.

Likewise a second comparator 208 may receive a first-input signal 208A from the memory-storage circuit 202 and a second-input signal 208B from the buffer circuit 204. During normal operation, the first-input signal 208A received by the second comparator 208 may correspond to a second data set stored in the memory-storage circuit 202. And, the second-input signal 208B received by the second comparator 208 may convey the new data set during normal operation.

The memory-management system 200 may comprise additional comparators to receive additional signals from the memory-storage circuit 202 and the buffer circuit 204. The Nth comparator 210 may receive a first-input signal 210A from the memory-storage circuit 202 and a second-input signal 210B from the buffer circuit 204. During normal operation, the first-input signal 210A received by the Nth comparator 2010B may correspond to an Nth data set stored in the memory-storage circuit 202. And, the second-input signal 210B received by the second comparator 208 may convey the new data set during normal operation.

Each of the comparators from the first comparator 206 to the Nth comparator 210 may compare the respective signals received. The first comparator 206 may produce a first-comparator output 206C. The second comparator 208 may produce a second-comparator output 208C. The Nth comparator 210 may produce a Nth-comparator output 210C. The outputs of the comparators may comprise a first state when inputs to the comparator are identical and a second state when they are different. For example, the output signal of one of the comparators may comprise a "1" if the inputs are identical and the output signal may comprise a "0" if the inputs are not identical. In various embodiments, the output signal may comprise a "0" if the inputs are identical and a "1" if the inputs are not identical.

The outputs of the comparators may be directed to a combinational logic circuit 212. In various embodiments, the combinational logic circuit 212 may comprise an AND tree that receives the comparator outputs. This may allow the memory-management system 200 to determine when the new data set received by the memory-management system comprises a unique data set not currently saved in the memory-storage. For example, in various embodiments when operating without errors the comparators may output a "1" if the input signals received by the respective comparators are mismatched and a "0" if they are matched. If the new data matches a data set stored in any location, the corresponding comparator will output a "0" because all the inputs for that comparator match. Any zero received by an AND tree will be pushed through to the output 213. Thus an output signal comprising a "0" at output 213 may indicate that a new data set is non-unique and already exists somewhere in the existing data By way of example, if there is a match between a data set stored in a first location of the memory-storage circuit 202 and the new data set, the first comparator 206 may output a "0" when operating correctly. The "0" will pass to the combinational logic circuit 212 and matriculate through an AND tree forcing the output 213 of the combinational logic circuit 212 to also comprise a "0" thus indicating that the new data set is not unique. It should be appreciated that in various embodiments this result may be accomplished by a comparator that outputs a "1" when there is match between input signals by using different combinational logic (for example NAND gates).

In various embodiments, the memory-storage circuit 202 may comprise a memory error table. In various embodiments, the buffer circuit 204 may comprise a new error buffer circuit.

The comparator-based redundancy system 100 and the memory-management system 200 both rely on one or comparators operating as expected. If a comparator fails to operate correctly, the comparator-based redundancy system 100 may fail to detect errors, or the memory-management system may fail to properly identify unique data sets. Comparators may develop permanent faults such as stuck at "0" faults where they only output signals comprising a "0."

In some cases, they may also develop stuck at "1" faults where they only output signals comprising a "1." In various applications, it may be advantageous to check the comparator to ensure that it is performing appropriately.

Hardware components may be tested using elements built into a chip. This allows a chip or system on a chip (SOC) to perform self-tests. Built-in Self Tests (BISTs), for example Logic BISTs, may add complexity to a chip, and current techniques face challenges as the SOCs themselves are becoming more and more complex. Comparators may be spread out among different locations on a SOC an in different clock domains. And, this can make it difficult to collect information and connect components for BISTs.

In various cases, a BIST may be performed at startup. For example, when an automobile is turned on, various tests may be performed to ensure safe operation of the automobile during ensuing operation. It may be desirable to perform tests as quickly as possible to avoid deleterious impact on user experience. In some cases, demands placed on the BIST may require completion in less than 5 ms. Further, power considerations may also constrain options because power usage should not exceed the maximum transient current limit for internal voltage regulators. A more streamlined BIST to test comparators may be advantageous to provide fast, reliable, and efficient tests for comparators.

Figure 3:
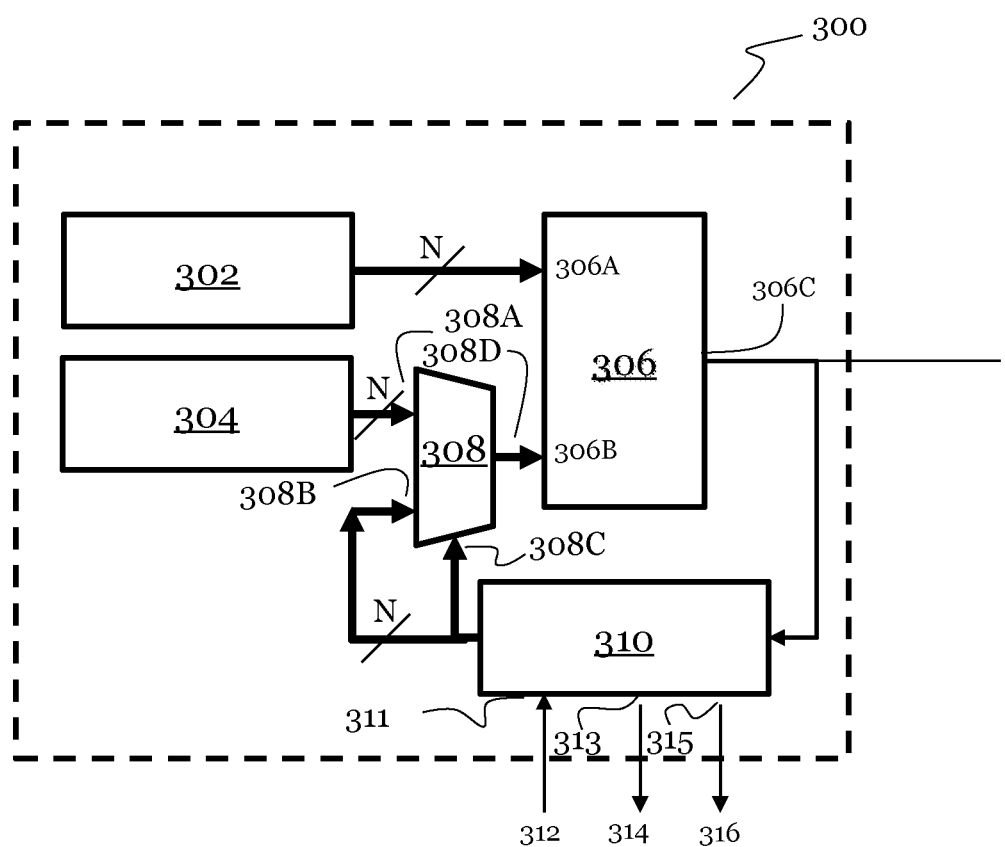
FIG. 3 depicts an embodiment of a comparator BIST device for a System on a Chip in accordance with an embodiment.

FIG. 3 depicts an embodiment of a comparator BIST device 300 for a SOC.

In various embodiments, the comparator BIST device 300 may comprise a comparator 306. The comparator 306 may comprise a first input port 306A and a second input port 306B. The first input port 306A may be configured to receive a first input signal. In various embodiments, the first signal may comprise different numbers of bits.

The comparator BIST device 300 may also comprise a second input port 306B. The second input port 306B may be configured to receive a second input signal. In various embodiments, the first input signal may comprise different numbers of bits. The second input signal may comprise the same number of bits as the first input signal. The comparator 306 may also comprise an output port 306C to produce an output signal. The output port 306C may be coupled with an error collector (not depicted in FIG. 3). The output port 306C may also be coupled with a test controller 310.

In various embodiments, comparisons between the first input signal and the second input signal by the comparator 306 may be accomplished bit by bit. For example, the individual bits from the first input signal may be compared with corresponding bits from the second input signal. Thus, a first input signal comprising N bits and a second input signal comprising N bits may be arranged into N bit pairs.

In various embodiments, the comparator 306 may receive N bit pairs. Each bit pair of the N bit pairs may be input to an XOR gate of the comparator 306 that, when operating as expected, outputs a "1" if the bits of the bit pair are not identical. For the purposes of this disclosure, bit pairs will be referred to as mismatched when the bits of the bit pair are not identical. In various embodiments, when both bits of a bit pair are identical, the XOR gate for the bit pair may be configured to output a "O." The outputs of each of the N XOR gates of the comparator 306 may be input into an OR tree. As a result, when any of the N bit pairs are mismatched the OR tree should receive a "1" as an input and the OR tree should also output a "1."

The comparator BIST device 300 may comprise a test controller 310 that may be disposed on the SOC and coupled with the first input port 306A and the second input port 306B. The test controller 310 may be configured to test the operation of the comparator 306 for permanent or temporary faults within the components of the comparator 306 like internal logic gates that are stuck at "1" or stuck at "0."

In various embodiments, the test controller 310 may test the operation of a comparator 306 by mismatching bit pairs. The test controller 310 may vary the signal received at the first input port 306A, the second input port 306B, or both so that the bit pairs are mismatched. For example, the test controller may cause one bit of a bit pair to comprise a "1" and a second bit of a bit pair to comprise a "0" while keeping all the other bit pairs of a comparator matched. When operating properly, the comparator should identify the mismatch and assume an expected output, which could be a "1" or a "0" depending on the configuration.

In various embodiments, the test controller 310, may be coupled with the output port 306C and determine whether a mismatch injected into the comparator 306 provokes the expected response in the output signal of the comparator 306. If the output signal assumes the expected output, the comparator 306 will pass the operability test for that bit pair. As can be appreciated, in various embodiments, the test controller 310 may not be coupled with the output port 306C and the output signal of the comparator 306 may be delivered to a different component to determine whether or not the output matches the expected output.

The process may be repeated for each bit pair to test that the comparator 306 will detect a mismatch that is presented between any of the bit pairs. The bit pairs may be mismatched one at a time until all bit pairs have been tested. In various embodiments, the test controller 310 may mismatch a first bit pair while holding the other bit pairs matched during one clock cycle. During a subsequent clock cycle, the test controller 310 may mismatch a second bit pair while holding the other bit pairs constant. This may continue mismatching one bit pair per clock cycle until all bit pairs have been tested. In various embodiments, the test controller 310 may hold the first input signal constant while varying the bits of the second signal to test the comparator 306. In various embodiments, the test controller 310 may hold the hold the second input signal constant while varying the bits of the first signal to test the comparator 306

The test controller 310 may also test that the comparator 306 responds as expected when the all bit pairs are matched. For example, in various embodiments, the comparator 306 may be configured to produce an output signal comprising a "0" when all the bit pairs input to the comparator 306 are matched. The test controller 310 may receive a signal from the output port 306C from the comparator 306 to confirm that that the output is "0" when the comparator 306 receives input from the first circuit 302 and input from the second circuit 304. In various embodiments, the comparator 306 may be configured to produce an output signal comprising a "1" when all the bit pairs input to the comparator 306 are matched. The test controller 310, may receive a signal from the output port 306C and confirm that the output is "1."

In various embodiments, the test controller 310 may comprise an initialization-input port 311 to receive an initialization signal 312 to initialize an operability test of a comparator 306. The test controller 310 may comprise a test-complete output port 313 to produce a test-complete signal 314. The test complete signal may communicate when a test of the operability of the comparator 306 has been completed. The test controller 310 may also comprise a test-results output 315 to produce a test-result signal 316. The test-result signal 316 may indicate whether the comparator 306 has passed or failed an operability test. For example, if the output of the comparator 306 comprises the output expected of the comparator 306 at all times during an operability test, the test-result signal 316 may communicate that the operability test has been passed. Otherwise, the test-result signal 316 may communicate that the operability test has been failed. In various embodiments, the test-result signal 316 may be sticky, which means that the test-result signal will communicate a failure if the output of the comparator 306 deviates from the expected output at any point during an operability test.

When an operability test is not being performed, the comparator 306 may receive a first-circuit signal from a first circuit 302 and a second-circuit signal from a second circuit 304. The comparator 306 may compare the signals during normal operation. In various embodiments the first circuit 302 may comprise a functional circuit and the second circuit 304 may comprises a redundant circuit. In various embodiments, the second circuit may be operated at a delay of one or two clock cycles This may allow a comparator 306 to catch a transient error in a clock signal, power line, or other coupling factor.

The comparator BIST device 300 may further comprise a selection circuit 308. The selection circuit 308 may determine whether the comparator 306 receives signals from the first circuit 302 and the second circuit 304 or signals that are controlled by the test controller 310. In various embodiments, the selection circuit 308 may comprise a MUX. The selection circuit 308 may comprise a first input 308A, a second input 308B, a control input 308C, and an output 308D. The MUX may receive signals at the first input 308A and the second input 308B and pass one of the signals to the output 308D depending on the signal transmitted to the control input 308C. For example, after the test controller 310 receives an initialization signal 312, the test controller 310 may deliver a control signal to the selection circuit 308 that causes the selection circuit to pass a signal received from the test controller 310. As will be appreciated, the selection circuit 308 may also comprise inputs to receive additional signals and comprise additional outputs. For example, the selection circuit 308 may comprise inputs to receive signals from the first circuit 302 and determine whether or not to pass the signal from the first circuit 302 on to the first input port 306A of the comparator 306.

As will be appreciated, many SOCs or other devices may comprise multiple comparators. In various embodiments, multiple comparator BIST devices 300 may be utilized in combination to test more than one comparator 306.

Figure 4:
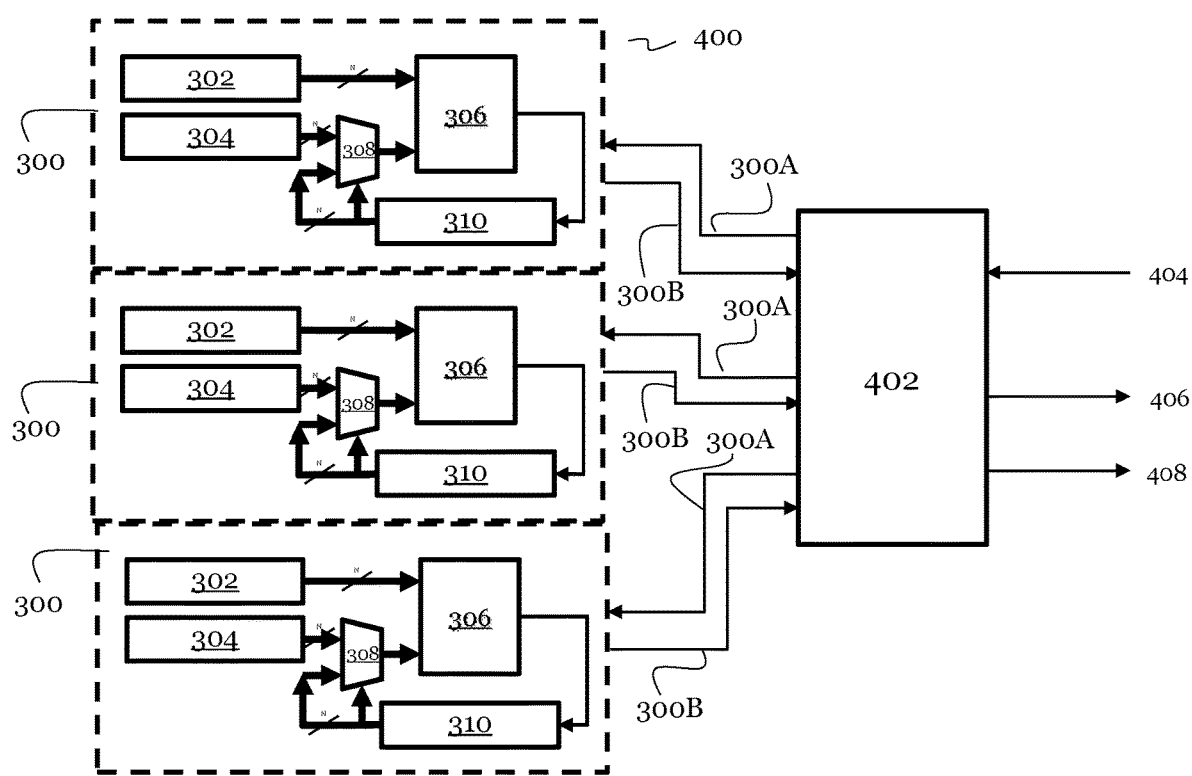
FIG. 4 depicts a system for testing comparators with a BIST device for a System on a Chip in accordance with an embodiment.

FIG. 4 depicts a system for testing comparators with a BIST device 400 for a SOC The system for testing comparators with a BIST device 400 for a SOC may comprise more than one comparator BIST device 300. Any comparator BIST device 300 may comprise any embodiment of a comparator BIST device 300 described in this disclosure.

In various embodiments, the test controller 310 of each comparator BIST device 300 may be coupled to a Comparator BIST ("CBIST") collector 402. Each comparator BIST device 300 may be coupled to the CBIST collector by an input connection 300A and an output connection 300B. The initialization signal 312 for each test controller 310 may be delivered to the initialization-input port 311 of the test controller 310 from the CBIST collector 402. The test-complete signal 314 may be delivered from the test-complete output port 313 to the CBIST collector 402. And, in various embodiments, the CBIST collector 402 may also receive the test-result signal 316 from the test-results output 315 of the test controller 310.

It may be advantageous to locate the test controller 310 near the comparator 306. And, the CBIST collector 402 may be used for gathering test results and signals from more than one test controller 310. This may be advantageous because it may allow shorter connections between a test controller 310 and a comparator 306. In various embodiments, the CBIST collector 402 may receive initialization signals 404 for operability tests that may be distributed by the CBIST collector 402 to an appropriate comparator BIST device 300 by an input connection 300A. The CBIST collector 402 may also output test results 406 that relay results of an operability test that was performed by a test controller 310 and received by the CBIST collector 402 at an output connection 300B. Similarly, the CBIST collector may also output test-complete signals 408 that relay information received at an output connection 300B that indicate when an operability test performed by a test controller 310 is complete. In various embodiments, the CBIST collector 402 may serve as an intermediary between a comparator BIST device 300 and an error test controller. The CBIST collector 402 may route signals between test controllers 310 and the error-test controller 502.

In various embodiments, it may also be desirable to test for stuck at "0" faults in the reporting logic for the output test results 406 (starting with the test-results signal 316 from the test controller 310 and continuing to the error-test controller 502). As will be appreciated, this may require additional logic to allow error-injection between components. It may be desirable to perform this test routine during an initial startup of a system. It also may be desirable to perform a test routine to test for a stuck at "1" fault in the test-complete signal 408 (starting at the test-complete signal 314 from test controller 310 and continuing to the error-test controller 502). As will be appreciated, this may require additional logic to allow error-injection between components.

It also may be advantageous to test the internal operation of the test controller 310. This may be accomplished by setting the output of the test-result signal 316 to a known output (either "1" or "0" depending on the embodiment) and confirming that the test-result signal 316 in fact responds as expected. In various embodiments, the test-complete signal 314 will not be asserted if the test-result signal does not pass the internal-operation test. And, various embodiments may implement a timeout watchdog in the error-test controller for the test-complete signal 408 to detect when the test-result signal and internal operation of the test controller 310 fail the internal-operation test. In various embodiments, it may be desirable to perform an internal-operation test before an operability tests is performed.

Figure 5A:
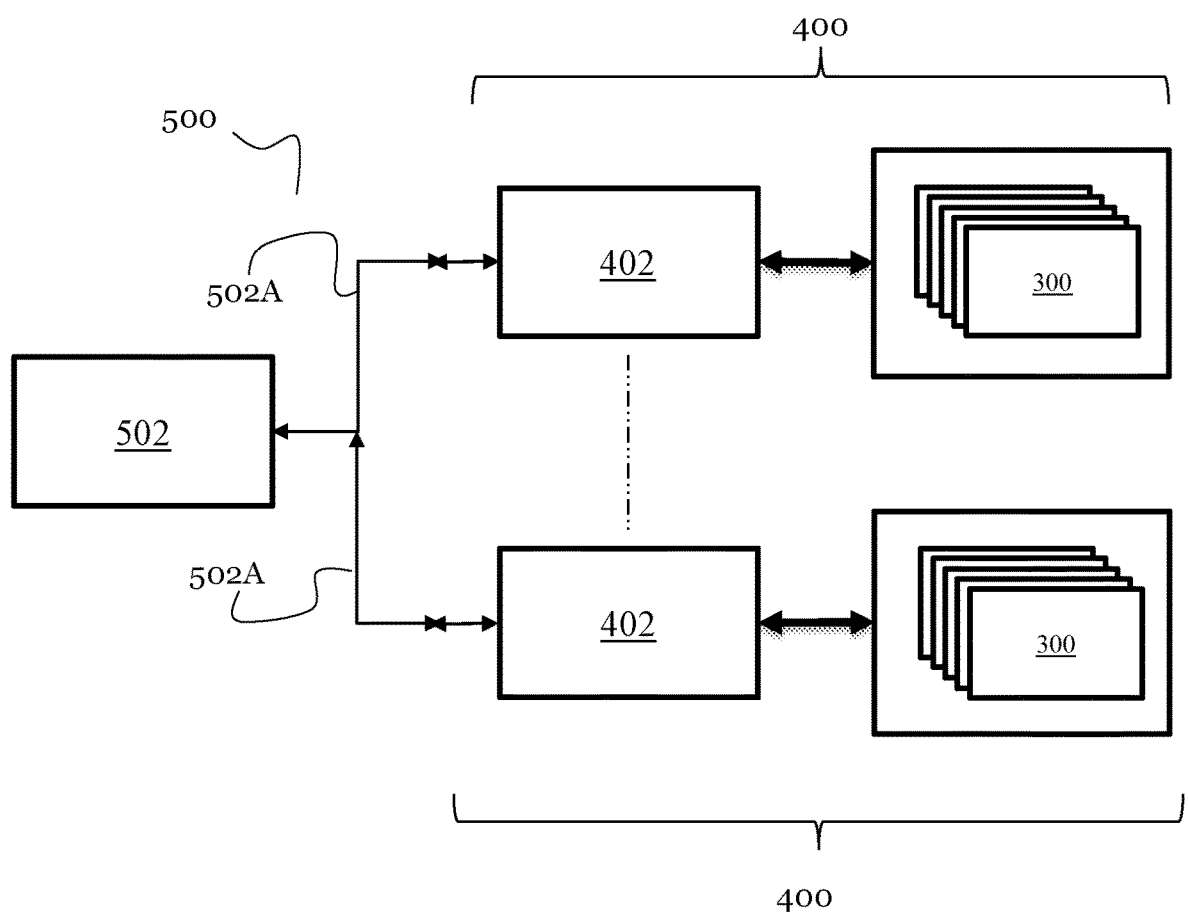
FIG. 5A depicts a system for testing comparators with a BIST device 400 for a System on a Chip with an error-test controller in accordance with embodiment.

FIG. 5A depicts a system 500 for testing comparators with a BIST device 400 for a SOC with an error-test controller In various embodiments, the system 500 may comprise an error-test controller 502. The error-test controller 502 may be coupled to more than one system for testing comparators with a BIST device 400. The error-test controller 502 may also be responsible to control other safety tests on a SOC such as Memory BIST or Logic BIST. The CBIST collector 402 of a BIST device 400 may be coupled with the error-test controller 502 by an input/output coupling 502A. Output test results 406 and output the test-complete signals 408 may be transmitted from a CBIST collector 402 to the error-test controller 502 by the input/output coupling 502A The error-test controller 502 may thus receive test results and test complete signals from multiple CBIST collectors 402 wherein each CBIST collector 402 serves as an intermediary between the error-test controller 502 and one or more comparator BIST devices 300.

The error-test controller 502 may initiate an operability test for a comparator BIST device 300 by delivering a signal to a CBIST collector 402 wherein each CBIST collector 402 serves as an intermediary between the error-test controller 502 and one or more comparator BIST devices 300. The CBIST collector 402 may then pass the start (initialization signal) on to a test controller 310, which in turn can asset a test-enable signal.

In may be advantageous to utilize a CBIST collector 402 as an intermediary between the error-test controller 502 and comparator BIST devices 300 because it may reduce complexity. Comparators 306 may be dispersed across various locations on a SOC. Comparators may be separated by logical (for example, time domain) or physical partitions. Individually wiring more than one test controller 310 to the error-test controller 502 may require many long connections between the test controllers 310 and the error-test controller 502. But, a CBIST collector 402 may be located relatively near to the test controllers 310 that the CBIST collector 402 is coupled with. Wiring from multiple test controllers 310 to the CBIST collector 402 may be relatively short. And, signals from the multiple test controllers 310 may be transmitted to the error-test controller 502 along a small number of wires connecting the CBIST collector 402 to the error-test controller 502 rather than a greater number of individual connections between the test controller 310 and the error-test controller 502. However, it various embodiments, it may be desirable to directly connect all or some of the test controllers 310 to the error-test controller 502.

Figure 5B:
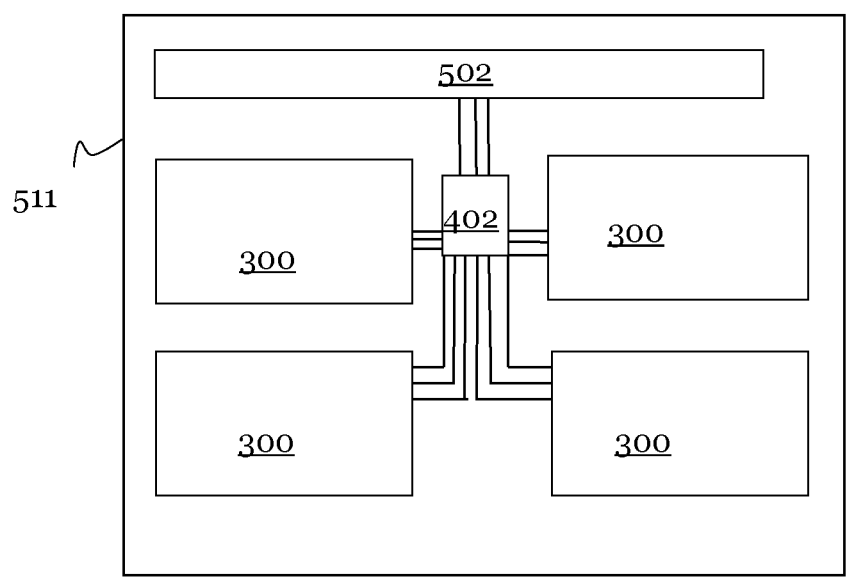
FIG. 5B depicts a system for testing comparators on a System on a Chip in accordance with an embodiment.

FIG. 5B depicts a system for testing comparators on a SOC.

The system 500 may be disposed on a SOC 511. In various embodiments, a CBIST collector 402 may serve as an intermediary between a plurality of comparator BIST devices 300 and the error-test controller 502, which may reduce complexity of the SOC 511

Returning to FIG. 5A, in various embodiments, the input/output coupling 502A may comprise three connections: one connection for initialization signals; one for test-result signals; and one for test-complete signals. In various embodiments, the test-result signals may only communicate whether an operability test has been passed or failed. However, additional information may be included such as the location of the failure within a comparator 306.

In various embodiments, a CBIST collector 402 is only coupled with comparator BIST devices 300 that are in the same time domain. This may be advantageous because it may reduce the number of clock signals needed for a CBIST collector 402. However, in various embodiments, a CBIST collector 402 may be coupled with comparator BIST devices 300 from different time domains. Additional logic for the CBIST collector 402 may be required to interface a comparator 306 from asynchronous time domains on a SOC.

Figure 6:
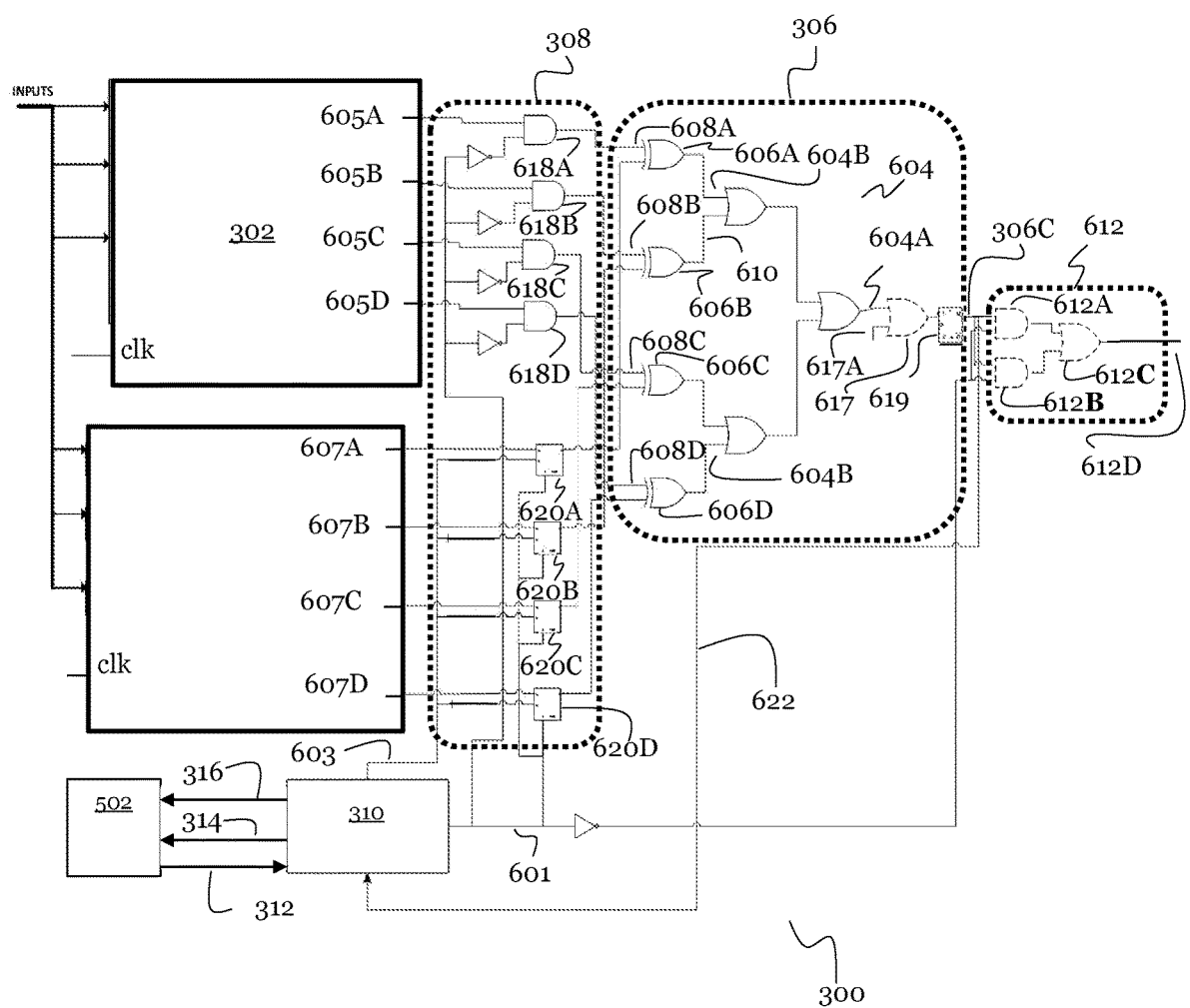
FIG. 6 depicts an embodiment of a comparator BIST device in accordance with an embodiment.

FIG. 6 depicts an embodiment of a comparator BIST device 300

In various embodiments, the selection circuit 308 is coupled with the first circuit 302 and the second circuit 304. The selection circuit 308 may receive an N bit first-circuit signal from the first circuit 302. The selection circuit 308 may receive an N bit second-circuit signal from the second circuit 304. The test controller 310 may be configured to produce a test-enable signal 601. In various embodiments, the selection circuit 308 may be configured to, depending on the test-enable signal, either: pass the first-circuit signal from the first circuit 302 to the first input port 306A of the comparator 306 and pass the second-circuit signal from the second circuit 304 to the second input port 306B of the comparator 306 when the test-enable signal is in a first state; or pass a first test signal from the test controller 310 to the first input port 306A, and pass a second test signal 603 from the test controller 310 to the second input port 306B when the test-enable signal is in a second state.

In various embodiments, a first bit 605A of the first-circuit signal of the first circuit 302 may be coupled with a first AND gate 618A of the selection circuit 308. A second bit 605B of the first-circuit signal may be coupled with a second AND gate 618B of the selection circuit 308. Additional bits of the first-circuit signal of the first circuit 302 may be coupled with additional AND gates. The first test signal delivered to the selection circuit 308 from the test controller 310 may comprise a test-enable signal 601 that has been inverted and coupled to the first AND gate 618A, second AND gate 619B, and additional AND gates coupled with additional bits of the first-circuit signal of the first circuit 302. When the test-enable signal comprises a "0" it may be inverted to a "i" and delivered to the first AND gate 618A, second AND gate 619B, and additional AND gates coupled with additional bits of the first-circuit signal of the first circuit 302 thereby allowing the first-circuit signal to be passed to the first input port 306A of the first comparator. When the test-enable signal 601 comprises a "1" it will be inverted before reaching the first AND gate 618A, second AND gate 619B, and additional AND gates coupled with additional bits of the first-circuit signal of the first circuit 302 thereby setting each bit delivered to the first input port 306A of the comparator 306 to a "0."

In various embodiments the second-circuit signal of the second circuit 304 may comprise a first bit 607A that is transmitted to a first MUX 620A of the selection circuit 308. The second-circuit signal of the second circuit 304 may comprise a second bit 607B that is transmitted to a second MUX 620B of the selection circuit 308. Additional bits of the of the second-circuit signal of the second circuit 304 may be transmitted to additional MUXs.

The first MUX 620A may also receive a first bit 603A of the second test signal 603. The second MUX 620B may also receive a second bit 603B of the second test signal 603. Additional MUXs of the selection circuit 308 may receive additional bits of the second test signal 603. The first MUX 620A, the second MUX 620B, and additional MUXs that receive additional bits of the second test signal 603 may also receive a control signal to select the MUX output. In various embodiments, the control signal may comprise the test-enable signal 601. And, in various embodiments, when the test-enable signal 601 comprises a "1," the first MUX 620A, the second MUX 620B, and additional MUXs that receive additional bits of the second test signal 603 may output the respective bits received from the second test signal 603. In various embodiments, when the test enable signal comprise a "0" the first MUX 620A, the second MUX 620B, and additional MUXs that receive additional bits of the second test signal 603 may output the respective bits of the second-circuit signal of the second circuit 304. The binary value of the test-enable signal may be reversed in various embodiments.

In various embodiments, the comparator 306 comprises an OR tree 604. The OR tree may comprise an OR-tree output 604A to produce an OR-tree output signal. The comparator may also comprise a first XOR gate 606A. The first XOR gate 606A may receive a first bit pair 608A. The first bit pair 608A may comprise a first bit of the first input signal, which, in various embodiments, may comprise the first bit 605A of the first-circuit signal or the first bit of the first-test signal depending on the test-enable signal 601. The first bit pair 608A may also comprise a first bit of the second input signal, which, in various embodiments, may comprise the first bit 607A of the second-circuit signal or the first bit of the second test signal 603 depending on the test-enable signal 601. When the first bit pair 608A matches, the first XOR gate 606A should export a "0," when operating without a fault. When the first bit pair 608A mismatches, the first XOR gate 606A should outputs a "1," when operating without a fault. The output of the first XOR gate 606A may be coupled to an input 604B of the OR tree 604.

The comparator 306 may also comprise a second XOR gate 606B. The second XOR gate 606B may receive a second bit pair 608B. The second bit pair 608B may comprise a second bit of the first input signal, which, in various embodiments, may comprise the second bit 605B of the first-circuit signal or the second bit of the first-test signal depending on the test-enable signal 601. The second bit pair may comprise a second bit of the second input signal, which may comprise second bit 607B of the second-circuit signal or a second bit of the second test signal 603 depending on the state of the test-enable signal. When the second bit pair 608B matches, the second XOR gate 606B outputs a "0," when operating without a fault. When the first bit pair 608A mismatches, the second XOR gate 606B outputs a "1," when operating without a fault. The output of the second XOR gate 606B may be coupled to an input 604B of the OR tree 604. Additional bit pairs may be coupled with additional XOR gates. In various embodiments, the comparator 306 may comprise one XOR gate for each bit pair.

In various embodiments, when operating without a fault, the OR tree 604 should produce an output signal comprising a "1" when the OR tree 604 receives a "1" at any input. The OR-tree should produce an output comprising a "0" when all of the inputs to the OR tree are "0," when operating without a fault. The comparator 306 may also comprise a flip flop 619 that may synchronize the OR-tree output 604A with a clock signal.

The comparators 306 may also comprise a gating circuit 612 coupled to an output port 306C of the comparator 306. The gating circuit 612 may prevent false errors from being reported to an error collector. An operability test of a comparator 306 may provoke the comparator to output signals that may be interpreted as errors if received by other components. In various embodiments, the gating circuit 612 may prevent this by coupling the output port 306C of the comparator 306 to an AND gate. In various embodiments the test-enable signal 601 may be inverted and also delivered to the AND gate. The test-enable signal 601 may comprise a "1" while a test of the comparator is ongoing. After inversion, a "0" may be input to an AND gate thereby blocking the output port 306C from delivering a signal to an error collector.

In various embodiments, the gating circuit 612 may comprise a first AND gate 612A, a second AND gate 612B, and an OR gate 612C. The first AND gate 612A and the second AND gate 612B may be coupled at their inputs with the output port 306C and the test-enable signal 601 (after inversion if necessary). The output of the first AND gate 612A, and the second AND gate 612B may be input to the OR gate 612C. The OR gate 612C may prevent a stuck at "0" fault in the first AND gate 612A or the second AND gate 612C from blocking errors that occur outside an operability test from reaching the error collector.

In various embodiments, the comparator 306 may comprise an OR gate 617. A first input of the OR gate 617 may be coupled to the OR-tree output 604A. The OR gate 617 may be used to test for faults in the gating circuit 612. The OR gate 617 may receive a signal at an input 617A. The signal may inject an error into the comparator 306. And, an output 612D of the gating circuit may be tested to confirm that the error matriculated through the gating circuit 612. The signal delivered to the input 617A may be delivered by a controller (not shown).

Figure 7:
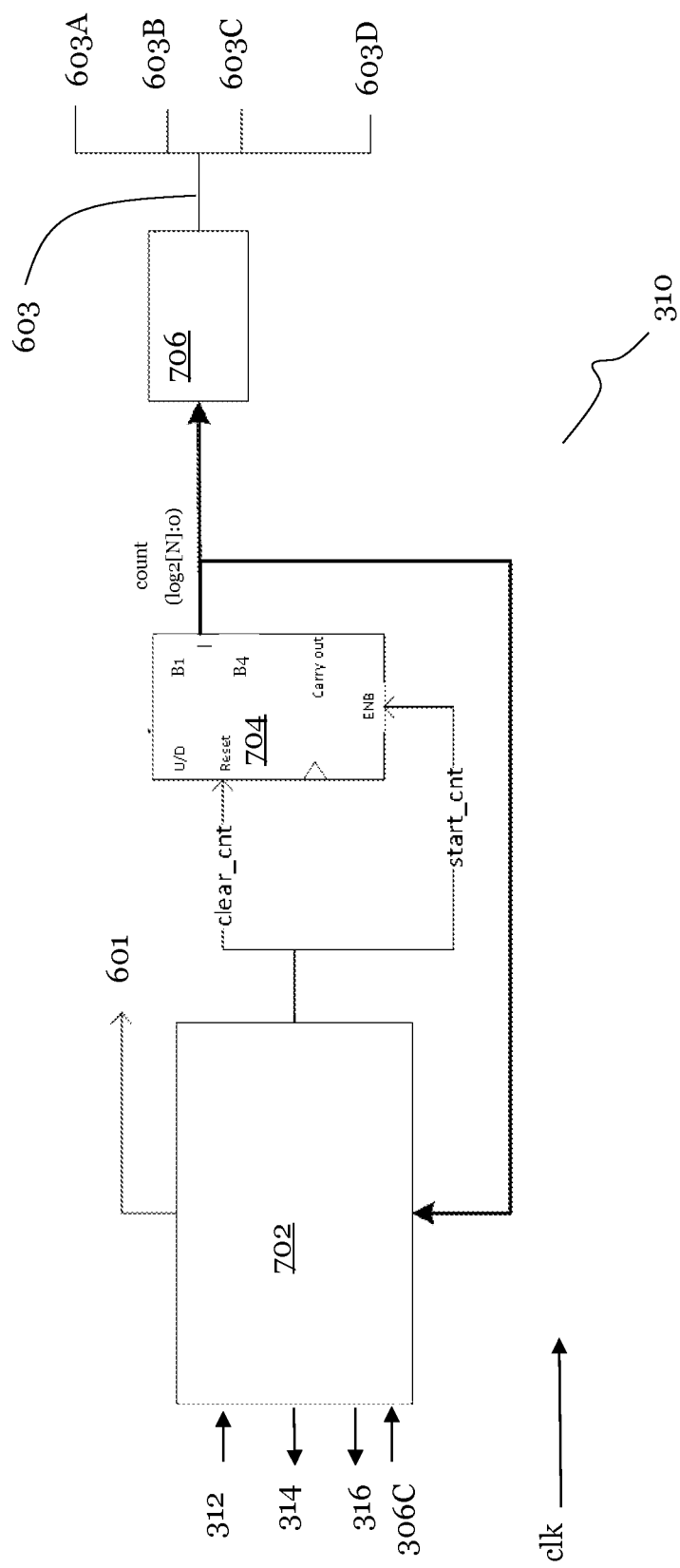
FIG. 7 depicts an embodiment of the test controller in accordance with an embodiment.

FIG. 7 depicts an embodiment of the test controller 310.

In various embodiments, the test controller 310 may comprise a finite state machine ("FSM") 702 that receives the initialization signal 312. In various embodiments, the FSM may also output the test-complete signal 314, test-result signal 316, test-enable signal 601, and receive output from the output port 306C.

The test controller 310 may further comprise a binary counter 704. The FSM 702 may be in communication with the binary counter 704. The FSM may be configured to prompt the binary counter 704 to begin a count by delivering an enabling signal (start_cnt) to the binary counter after the FSM 702 has received an initialization signal to begin an operability test. The range of the count performed by the binary counter may be equal to the number of bit pairs of a comparator 306 to be tested. For example, if an operability test is being performed on N bit pairs, the binary counter may count from 1 to N resulting in a count that is N cycles.

The binary counter 704 may be coupled to a binary decoder 706 to convert the count performed by the binary counter into outputs. The output of the binary decoder 706 may comprise the second test signal 603. A first output of the binary decoder 706 may produce the first bit 603A of the second test signal 603, a second output of the binary decoder 706 may produce second bit 603B of the second test signal 603, and additional bits of the binary decoder 706 may produce additional bits of the second test signal 603. The number of outputs of the binary decoder may be equal to the number of bit pairs of a comparator.

As the binary counter 704 progresses through a count binary decoder may output a "1" to a corresponding output. For example, when the count is at 1, the binary decoder may output a "1" as the first bit 603A of the second test signal 603 while the remaining bits are set to "0." When the count is at 2, the binary decoder may output a "1" at the second bit 603B of the second test signal 603 while the remaining bits are set to "0." This may continue until the count is complete.

Figure 8:
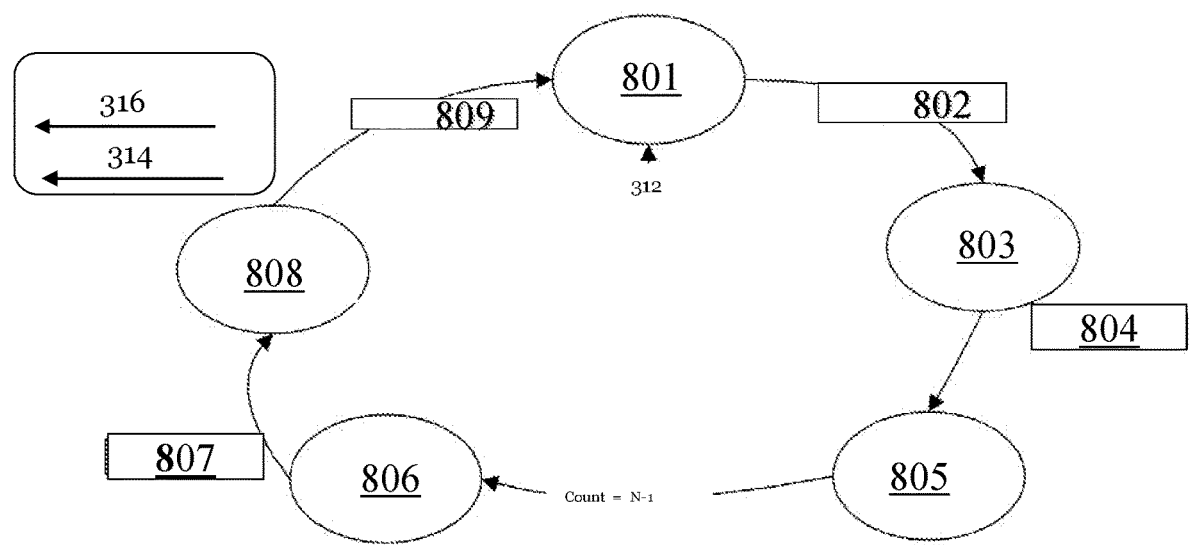
FIG. 8 depicts a state diagram for a Finite State Machine in accordance with an embodiment.

FIG. 8 depicts a state diagram for a Finite State Machine ("FSM") 702.

The FSM begins at an idle state 801. In various embodiments, a test may be triggered by an initialization signal 312. The initialization signal 312 may be received from the CBIST collector 402 as an intermediary for an error-test controller 502. In various embodiments, a test may be performed every time a system is started. For example, when a car is turned on. As a result, the initialization signal 312 may be asserted every time the system is turned on. The initialization signal may be asserted with different values in different embodiments. For example, an initialization signal comprising a "1" may trigger an operability test. And, in various embodiments, an initialization signal comprising a "0" may trigger an operability test.

Receiving an asserted initialization signal 312 triggers the FSM to exit the idle state. In various embodiments, the FSM may assert a Test_Start signal at 802. The Test-Start signal may be configured to last for a predetermined number of clock cycles that corresponds to the time needed to complete a test. The Test-start signal may be internal to the FSM. The Test-Start signal may trigger an internal-operations test. This may be accomplished by setting the output of the test-result signal 316 to a known output and testing that it reacts as expected. For example, the test-result signal 316 may be set to a "1" and tested to ensure that the test-result signal 316 is not stuck at "0." As will appreciated, clock delays may cause tests initialized during one clock period to be completed during subsequent clock periods.

At 803, the FSM comprises a check initial level state. At this time, the test-enable signal 601 may be asserted. The test-enable signal 601 may be timed to be de-asserted after a set number of clock cycles passes. The number of clock cycles may depend on the number of bit pairs that are being checked. For example, the test-enable signal may be timed to be de-asserted after all bit pairs have been mismatched.

During the check initial level state 803, bit pairs may be matched to determine if a comparator 306 produces the output expected when all inputs are matched. In various embodiments, the inputs to the comparator 306 may be matched by using the selection circuit 308. In various embodiments, the selection circuit 308 may only be coupled with the second circuit 304. The first circuit may not be receiving input, as a result, the output of the first circuit 302 may be known, so it may be desirable to couple only the second circuit 304 with a selection circuit 308.

In various embodiments, the check initial level state 803 may have a duration equal to a single clock cycle. At 804, the FSM triggers the binary counter 704 to begin a count. For example, this may occur, in various embodiments by delivering a start_cnt signal comprising a "1" to an input ENB of the binary counter 704. From 805 to 806, bit pairs of the comparator 306 are mismatched one by one as the binary counter 704 progresses through the count and the binary decoder 706 generates outputs. During states 803 to 806, the FSM may monitor the signal at the output port 306C to check whether the output matches the expected output. For example, if the signal at the output port 306C deviates from the expected output (either "1" or "0" depending on the embodiment) the test-result signal 316 may be asserted to indicate an error. In various embodiments, there may be a delay between the time when an operability test is initialized the time when the output is verified. The delay may vary depending on the configuration of the comparator BIST device 300. For example, the delay may comprise one clock cycle, two clock cycles, three clock cycles or another number of clock cycles. At the state, 808, the FSM may report the results of the operability testing. In various embodiments, if an internal-operation test is passed, the test-complete signal 314 may be asserted. In various embodiments, the test-complete signal 314 may be timed to be asserted after the final bit pair has been matched if the internal-operation test is passed.

In various embodiments, the value of the count may be checked at state 808 to confirm that the count is equal to N. This may be performed to detect self-faults in a counter, for example 704, or the FSM 800. After the value of the count has been checked, the clear_cnt signal may be set to "1."

In various embodiments, it may be advantageous to monitor the test-enable signal 601 of the test controller 310 when the FSM 702 is in the idle state 801. The FSM may comprise the idle state 801 when the first circuit 302 is used for operations, which may be referred to as mission mode. A test-enable signal 601 that is incorrectly asserted during mission mode may interfere with proper operation of the comparator 306 to test the first circuit 302 and the second circuit 304. So, it may be advantageous to monitor the test-enable signal 601 during mission mode. If the test-enable signal 601 is asserted while the FSM 702 is in an idle state the FSM 702 may be configured to assert the test-result signal 316 to indicate that there is an error. In various embodiments, the FSM 702 may be configured to control the state of the test-result signal 316. For example, the FSM 702 may be configured to assert the test-result signal 316 if the test-enable signal is detected while the FSM 702 is in the idle state 801. The test-result signal 316 may be coupled to other components that process and report the error (for example, the CBIST collector 402 and error-test controller 502 as described at least with reference to FIG. 5a.) In various embodiments, the timing of the transitions from state to state of the FSM may be controlled by a clock signal and the various states may be configured to last a specified number of clock periods. In various embodiments, some of the states may be transitioned by the count.

In various embodiments, test-result signal 316 may comprise a "1" if the output at the output port 306C deviates from the expected output for any clock interval. In various embodiments, test-result signal 316 may comprise a "0" if the output at the output port 306C deviates from the expected output for any clock interval. In various embodiments, test-result signal 316 comprising a "0" may indicate that an operability test has been passed and a "0" may indicate that an operability test has been failed. At a step 809, the initialization signal is returned to its original state.

Figure 9:
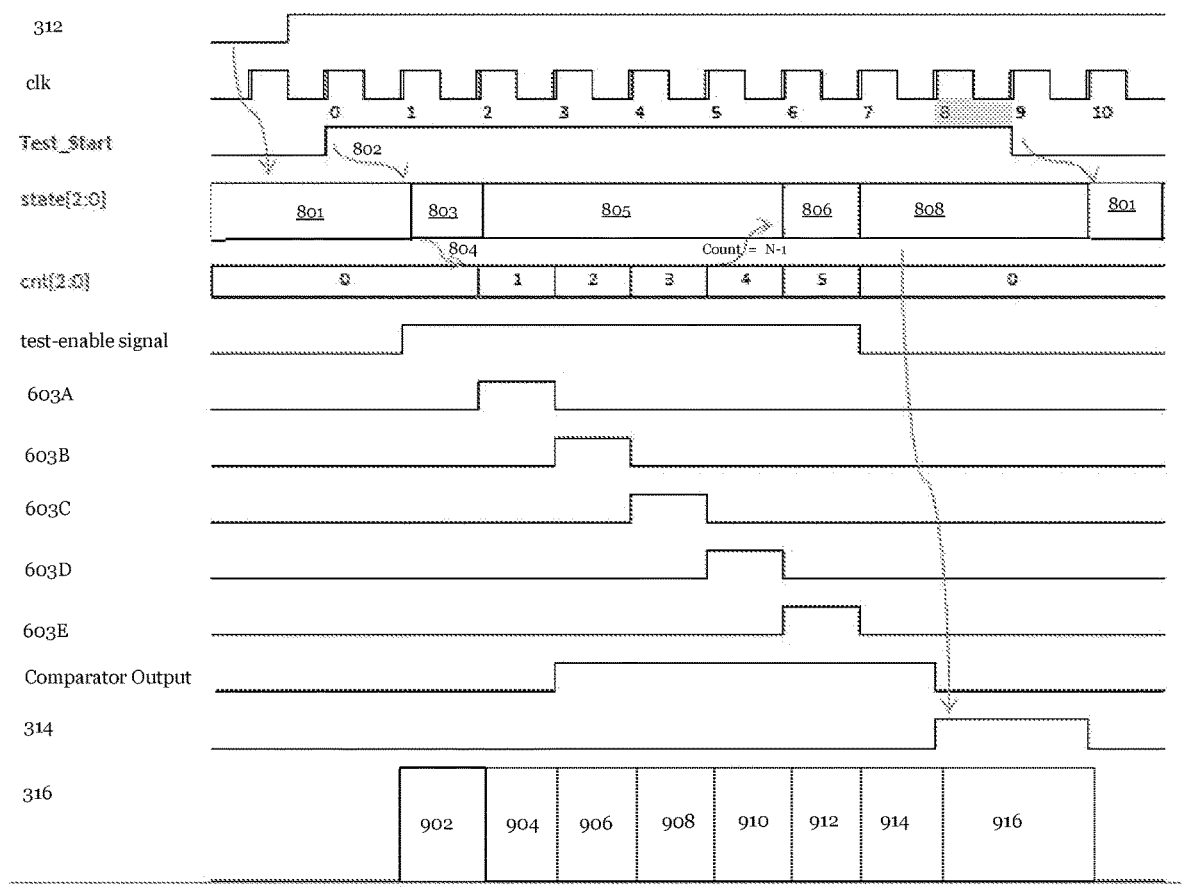
FIG. 9 is a diagram depicting example waveforms of the a comparator BIST Device in accordance with an embodiment.

FIG. 9 is a diagram depicting example waveforms of a comparator BIST Device 300.

As shown in FIG. 9, an operability test of a comparator 306 may be initialized when the initialization signal 312 is asserted. The Test-Start signal may then be asserted at the next clock cycle, clock cycle "0." The Test-Start signal may trigger an internal operations test and assertion of the test-enable signal 601, which will begin the next clock cycle, clock cycle "1." For the internal operations test, the test-results signal may be asserted at 902.

The FSM moves out of idle state 801 at clock cycle 1. In various embodiments, the test-enable signal 601 may be set to a state that causes the selection circuit 308 pass signals from the test controllers 310 to the comparator 306. In various embodiments the delay between reception of an initialization signal 312 and assertion of the test-enable signal 601 may be more than one clock cycle, depending on the architecture. After receiving an initialization signal 312, and after any delay, the comparator BIST device 300 may move into an operability and self-fault test to check that the output of the comparator comprises the expected output when all the inputs of the comparator match (when the count from binary counter 704 is at 0 and all outputs are at "0," in various embodiments).

During this time period, the test-results signal 316 may be asserted to indicate an error if the output of the comparator from output port 306C does not match the expected output. For this example, the expected output when the bit pairs are matched may be "0." And, the expected output when the bit pairs are mismatched may be "1" when the bit pairs are mismatched. As a result, in this example, the test-results signal 316 will be asserted to indicate an error during the time period denoted in the area 904 if the comparator output from output port 306C is a "1." In the example depicted in FIG. 9, the test-results signal 316 in not asserted in 904 because the comparator output is maintained at "0," the expected output. In various embodiments, this may be performed during startup of a device.

At clock cycle 2, the count reaches one and the first bit 603A of the second test signal 603 produces a "1." After a delay of 1 clock cycle, the output from output port 306C of comparator 306 rises to "1" at clock cycle 3. As the count continues, the output of the second bit 603B, third bit 603C, fourth bit 603D and fifth bit 603E rise and fall, which tests that the comparator 306 can detect a mismatch at each of these bit pairs. The expected output of the comparator remains at "1" as long as bit pairs are mismatched in the example waveform depicted. If there is deviation between the expected output and the output received from output port 306C the test will be failed and the test-result signal 316 will be asserted to indicate an error. One bit pair may be checked per cycles as the count cycles. The test-result signal may be asserted during the time period denoted 906 if there is an error detected with the first bit pair. The test-result signal may be asserted during the time period denoted 908 if there is an error detected with the second bit pair. The test-result signal may be asserted during the time period denoted 910 if there is an error detected with the third bit pair. The test-result signal may be asserted during the time period denoted 912 if there is an error detected with the fourth bit pair. The test-result signal may be asserted during the time period denoted 914 if there is an error detected with the fifth bit pair. For the waveform depicted in FIG. 9, the comparator output remains at the expected output for the duration of these periods (at "1" in this example) so the test-result signal 316 is not asserted.

From clock cycle 6 to clock cycle 7, the last bit pair is mismatched as the output for 603E is set to 1. And, after the clock delay, at clock cycle 8, the comparator output from output port 306C returns to "0." The comparator output matched the expected output at all times during the operability tests. And, the test-complete signal is given a "1." As can be appreciated, the binary values of some of these waveforms may be inverted in various embodiments of the comparator BIST device 300. The states of the FSM 702 may be stored in flops.

In various embodiments the test controller 310 may comprise a walking one pattern injector to mismatch the bit pairs for testing a comparator 306. In various embodiments, a walking one pattern injector is implemented with a shift register. In various shift register may be implemented using first circuit 302 and the second circuit 304.

It may be advantageous to make comparisons for a single signal across more than one comparator 306. For example, comparisons between 16 bit signals may be made using two comparators 306, each of which that comprises 8 bits, rather than a single 16 bit comparator. This may be preferable for high frequency applications.

Figure 10:
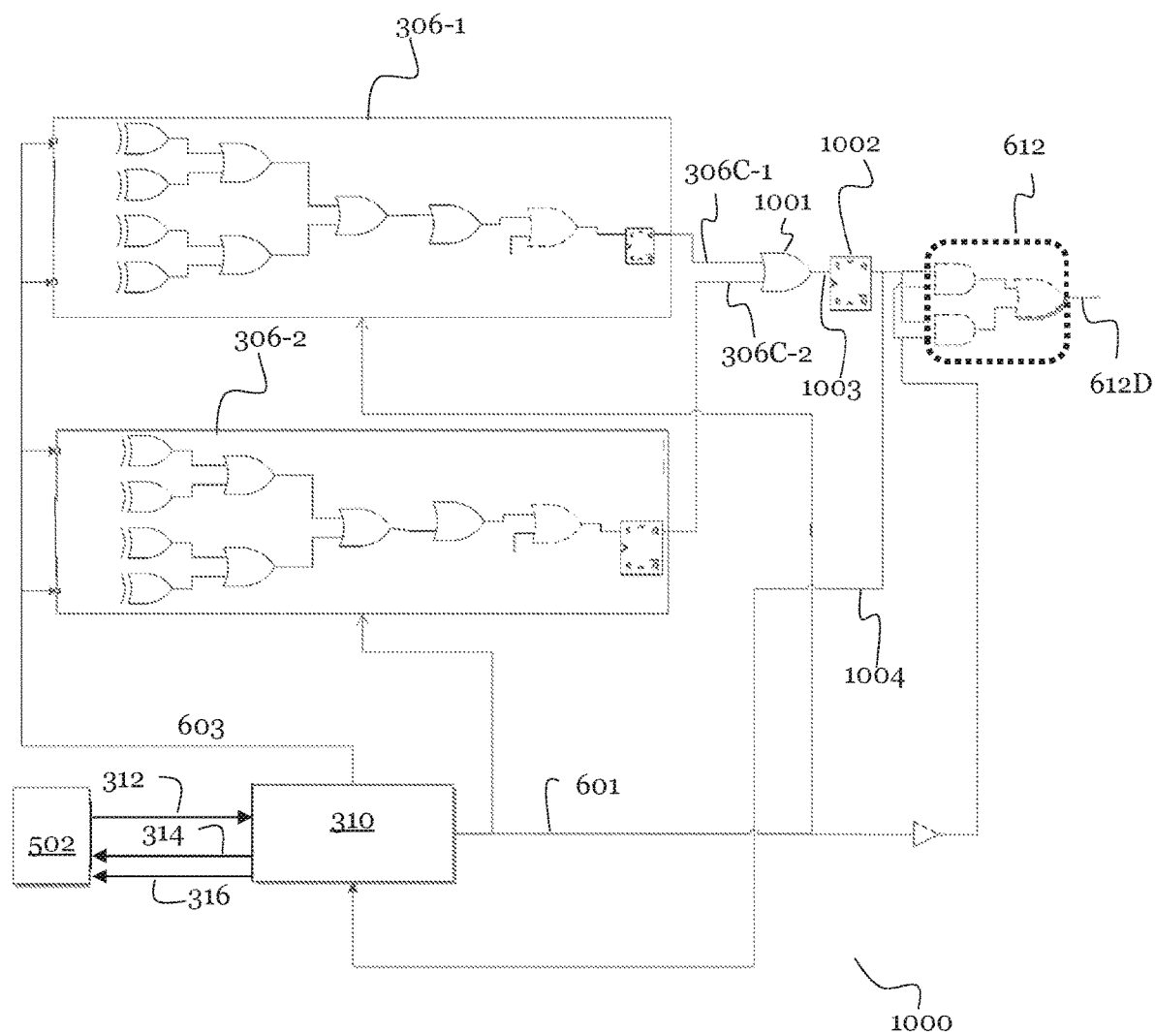
FIG. 10 depicts a comparator BIST for multi-comparator signals in accordance with an embodiment.

FIG. 10 depicts a comparator BIST for multi-comparator signals.

FIG. 10, depicts a first comparator 306-1 and a second comparator 306-2. Unless otherwise noted, a first comparator 306-1 and second comparator 306-2 may comprise any embodiment of comparator 306 referenced in this disclosure. It should be noted that FIG. 10 depicts couplings among the first comparator 306-1, second comparator 306-2, the test controller 310, the error-test controller 502, or the gating circuit 612. However, the comparator BIST for multi-comparator signal may also comprise the first circuit 302, second circuit and other components elsewhere described in this disclosure.

In various embodiments both the first comparator 306-1 and the second comparator 306-2 may be coupled with the test controllers 310 to receive second test signal 603. A first portion of the second test signal 603 may be delivered to a first comparator 306-1 and a second portion of the second test signal 603 may be delivered to a second comparator 306-2. For example, the first 4 bits of a second test signal 603 that is 8 bits may be delivered to the first comparator 306-1 and the last 4 bits of the second test signal 603 that is 8 bits may be delivered to the second comparator 306-2. In various embodiments, each of the 8 bits may be varied one-by-one to test the first comparator 306-1 and the second comparator 306-2 for faults.

An output 306C-1 of the first comparator 306-1 and an output of the second comparator 306C-2 may be coupled to an OR gate 1001. The OR-gate output 1003 may be coupled with a flip flop 1002. And, the output 1004 of the flip flop 1002 may be coupled to the test controller 310. The output produced at the output 1004 may be used to compare with expected output. For example, when all inputs to the first comparator 306-1 and the second comparator 306-2 are identical the output signal produced at the output 1004 may be expected to comprise a "0" in various embodiments. And, when inputs to the first comparator 306-1 and the second comparator 306-2 deviate, the output may be expected to comprise a "1." It should also be appreciated that inclusion of flip flop 1002 may also introduce an additional delay of one clock cycle. In various embodiments the test-enable signal 601 may be delivered to a selection circuit 308 as described at least with reference to FIG. 3 and FIG. 6.

It may also be advantageous to test comparators used for memory-management system 200 for potential faults.

Figure 11:
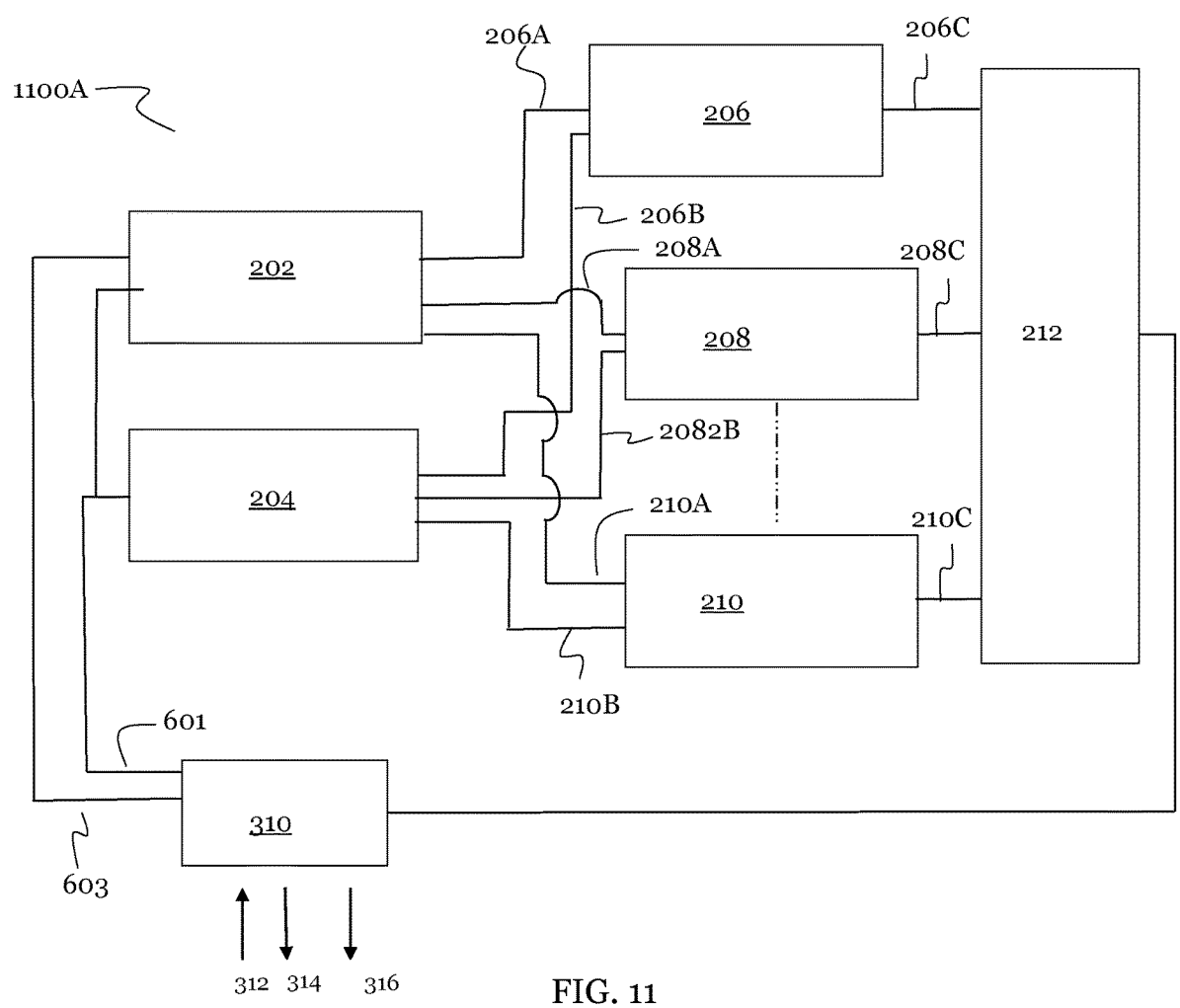
FIG. 11 depicts a comparator BIST device to test comparators of a memory-management system in accordance with an embodiment.

FIG. 11 depicts a comparator BIST device 1100 to test comparators of a memory-management system 200.

The N comparators of the memory-management system 200 may comprise any embodiment of comparator 306 described elsewhere in this disclosure. In various embodiments, a test controller 310 may receive an initialization signal 312 to begin an operability test of the N comparators of the memory-management system 200. The test controllers 310 may deliver a test-enable signal 601 to the buffer circuit 204 and the memory-storage circuit 202. In various embodiments, the comparator BIST device 1100 may also comprise a selection circuit 308 disposed between the buffer circuit 204 or the memory-storage circuit 202 and the buffer circuit 204 and the comparators. The selection circuit 308 may comprise any embodiment of this disclosure, for example, as described with reference to FIG. 3 and FIG. 6. In various embodiments, the selection circuit 308 may be comprised as part of the memory-storage circuit 202 and the buffer circuit 204. When the test-enable signal 601 is asserted, the selection circuit 308 may pass data for the performance of the operability test to the comparators. When the test-enable signal 601 is not asserted, the memory-storage circuit 202 and the buffer circuit 204 may be in a functional or mission mode as described with reference to FIG. 2. The buffer circuit may comprise a selection circuit 308 and the first test signal may be passed to the N comparators. In various embodiments, the selection circuit 308 may comprise an AND gate for each bit of the output of the buffer circuit 204. The AND gate for each bit may also receive a test-enable signal 601 that has been inverted. In various embodiments, the selection circuit 308 may comprise a MUX for each bit of output of the memory-storage circuit 202. Each MUX may receive one bit of output from the memory-storage circuit 202 and one bit of the second test signal 603. Each MUX may also receive the test-enable signal 601 to select between the bit received from the memory-storage circuit 202 and the bit received from the second test signal 603. In various embodiments the test signal delivered to the N comparators may comprise the test-enable signal 601 or a test-enable signal 601 that has been inverted. In various embodiments, the first test signal may be passed as the second input signal 206B, the second-input signal 208B, the second-input signal 210B and any additional second-input signals of any additional comparators.

The test controller 310 may also be configured to deliver the second test signal 603 to the memory-storage circuit 202. The memory-storage circuit 202 may pass the second test signal 603 to the N comparators. In various embodiments, the second test signal may be passed as the first input signal 206a, the second-input signal 208a, the first-input signal 210A and any additional first-input signals of any additional comparators. Bit pairs of the comparator may comprise a first bit from the first test signal and a second bit from the second test signal.

The test controller 310 may perform the operability test by instructing the memory-storage circuit 202, the buffer circuit 204 or both to mismatch one bit pair at a time per comparator of the N comparators. For example, during a first clock cycles a first bit pair of the first comparator 206 may be mismatched. The remaining bit pairs of the first comparator will be matched. If operating properly, the first comparator 206 should produce a signal at the first-comparator output 206C that comprises the expected state for mismatched signals. Also during the first clock cycle a first bit pair of the second comparator 208 may be mismatched. The remaining bit pairs of the second comparator will be matched. If operating properly, the second comparator 208 should produce a signal at the second-comparator output 208C that comprises the expected state for mismatched signals. This may be repeated so that each of the N comparators has one mismatched bit pair during one clock cycle. Each of the N comparators should produce a signal that comprises the expected state for a mismatched signal (which can be "1" or "0" in different embodiments). But, if any one of the N comparators fails to respond as expected, the failure will push a "0" through the combinational logic circuit 212 revealing a fault. This process can be repeated for each bit pair. For example, if each of the N comparators has 49 bit pairs, the process will be repeated 49 times, once for each bit pair.

In various embodiments, the comparator BIST device 1100 may comprise a flip flop at the output of the combinational logic circuit 212.

Figure 11A:
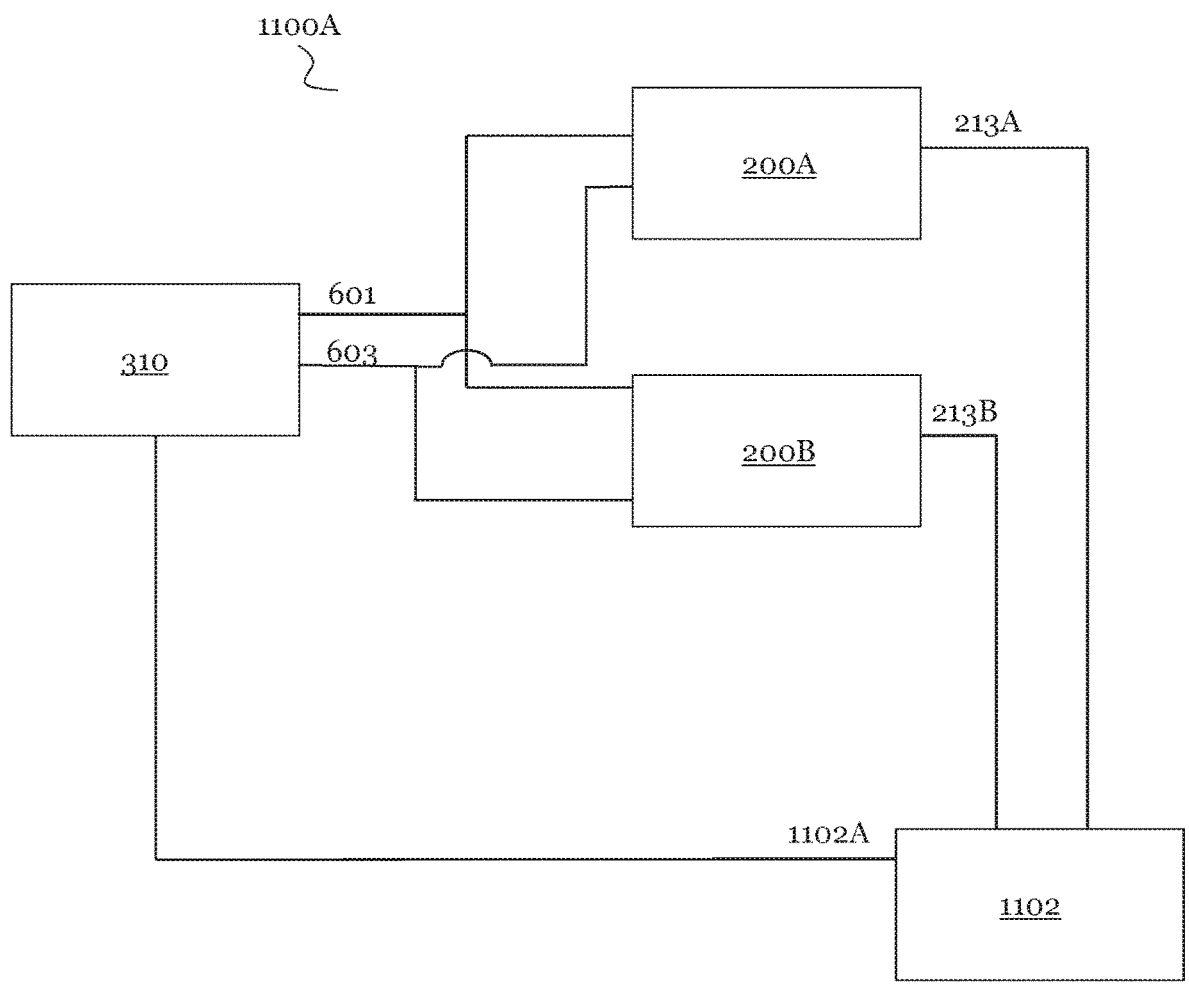
FIG. 11A depicts a comparator BIST device to concurrently test comparators of multiple memory-management systems in accordance with an embodiment.

In various embodiments, a test controller 310 may be used to concurrently test multiple memory-management system 200. FIG. 11A depicts a comparator BIST device 1100A to concurrently test comparators of multiple memory-management systems.

In various embodiments, the test controller 310 may be coupled with a first memory-management system 200A and a second memory-management system 200B to deliver the test-enable signal 601 and the second test signal 603. In various embodiments, the comparator BIST device 100A may comprise more memory management systems. The output 213A of the first memory-management system 200A and the output 213B of the second memory-management system 200B may be input to an OR logic 1102 and output 1102A provided to the test controller 310 to allow simultaneous testing of both the first memory-management system 200A and the second memory-management system 200B. As can be appreciated, in various embodiments the comparator BIST device 100A may comprise more memory-management systems 200 coupled with an OR logic 1102.

Figure 12:
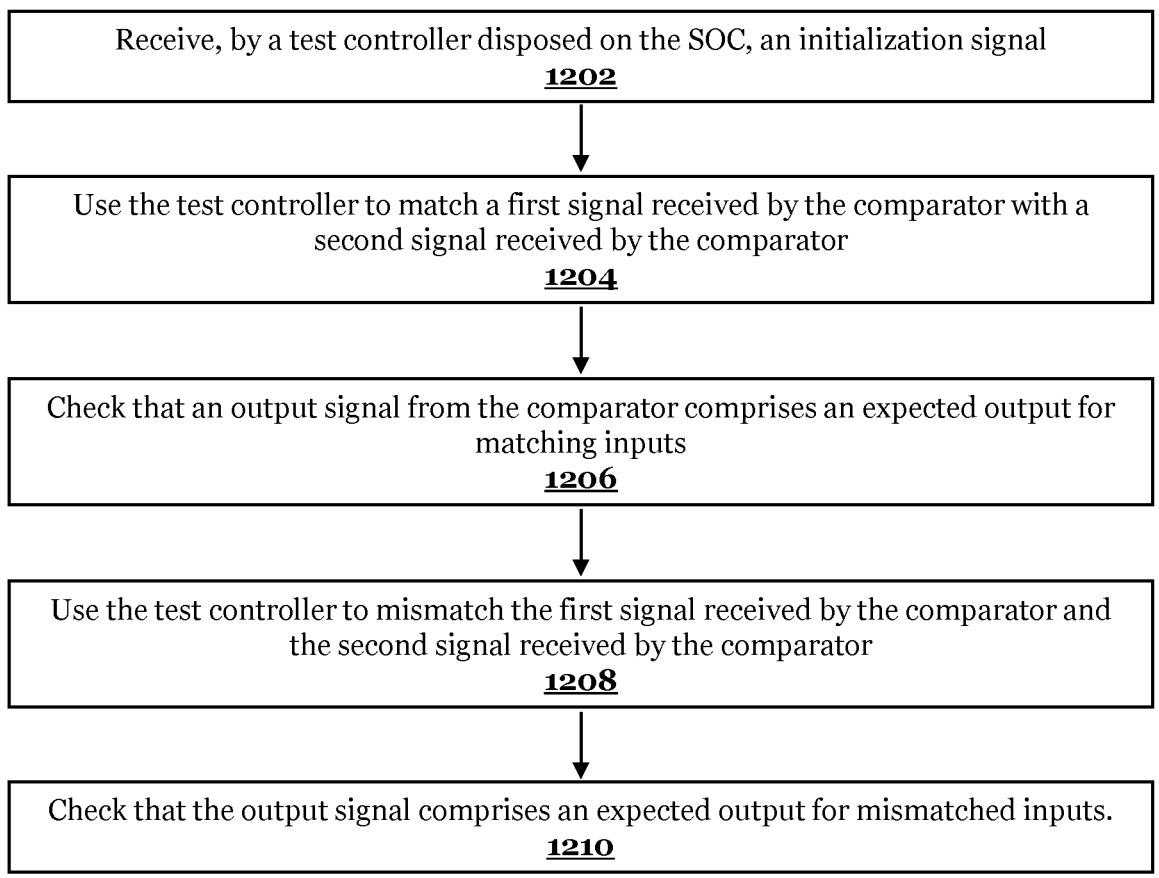
FIG. 12 depicts a method to test operations of a comparator on a system on a chip in accordance with an embodiment.

FIG. 12 depicts a method 1200 to test operations of a comparator on a system on a chip.

The method 1200 may comprise in various embodiments: at a step 1202 receiving, by a test controller disposed on the SOC, an initialization signal; at a step 1204 using the test controller to match a first signal received by the comparator with a second signal received by the comparator; at a step 1206 checking that an output signal from the comparator comprises an expected output for matching inputs; at a step 1208 using the test controller to mismatch the first signal received by the comparator and the second signal received by the comparator; and at a step 1210 checking that the output signal comprises an expected output for mismatched inputs.

In various embodiments, the method 1200 may further comprise, receiving, by the test controller, the output signal.

In various embodiments, the method 1200 further comprises performing the check that the output signal from the comparator comprises the expected output for matching inputs during a startup of the SOC.

The method 1200 may further comprise, wherein the test controller is used to check that the output signal comprises the expected output for matching inputs and the test controller is used to check that the output signal comprises the expected output for mismatched inputs.

The method 1200 may further comprise, in various embodiments, determining, by the test controller, that the output signal does not comprise an expected output for mismatched inputs; and generating, by the test controller, an error signal.

In various embodiments, the method 1200 may further comprise performing an internal-operations test by confirming that the error signal may be toggled from a first state to a second state.

In various embodiments, the method 1200 may further comprise, wherein the first signal comprises N bits and the second signal comprises N bits.

In various embodiments the method 1200 further comprises, splitting the first signal and the second signal into N bit pairs, each bit pair comprising one bit from the first signal and one bit from the second signal; and wherein using the test controller to mismatch the first signal received by the comparator and the second signal received by the comparator comprises mismatching each bit pair one of the N bit pairs at a time.

In various embodiments, the method 1200 may further comprise wherein the test controller asserts a test-enable signal during the first operability test and asserts the test-enable signal during the second operability test and wherein the test controller generates an error signal if the test-enable signal is asserted when neither the first test nor the second test are being performed.

In various embodiments, the method 1200 further comprises asserting a test enable signal by a test controller during test operations of a comparator on a system on a chip and generating an error signal, by the test controller, when the test-enable signal is asserted when test operations are not being performed.

In various embodiments, the method 1200 further comprises asserting a test-enable signal by a test controller during test operations of a comparator on a system on a chip and generating an error signal when the test-enable signal is asserted when test operations are not being performed.

Example 1. A built-in self-test device for a system on a chip (SOC), the built-in self-test device including: a comparator disposed on the SOC and including; a first input port to receive a first input signal; a second input port to receive a second input signal; an output port to produce an output signal; wherein the first input signal and the second input signal are split into N bit pairs each bit pair comprising one bit from the first input signal and one bit from the second input signal; and wherein the comparator is configured so a mismatch between the first input signal and the second input signal causes the output signal to comprise a first expected state; and a test controller on the SOC and coupled with the first input port, the second input port, and the output port, the test controller being configured to perform a first operability test by generating a mismatch for each of the N bit pairs and verifying that the output signal comprises the first expected state in response to the mismatch for each of the N bit pairs.

Example 2. The device of Example 1, wherein the test controller is configured to mismatch the N bit pairs one at a time.

Example 3. The device of Example 1 or 2 wherein the comparator is configured so a match between the first input signal and the second input signal causes the output signal to comprise a second expected state; and the test controller is configured to perform a second operability test by matching the N bit pairs and verifying that the output signal comprises the second expected state.

Example 4. The device of Examples 1 to 3 wherein the comparator includes: an OR tree including an OR-tree output to produce an OR-tree output signal; and N XOR gates, each XOR gate receiving one of the N bit pairs and each XOR gate including an XOR output coupled to an input of the OR tree.

Example 5. The device of Examples 1 to 4, wherein the test controller is configured to: receive an initialization signal to initialize the first operability test; output a test-complete signal; and output a test-result signal.

Example 6. The device of Examples 1 to 5, further wherein: the test controller includes: a finite state machine that receives the initialization signal; a binary counter that is in communication with the finite state machine and configured to initialize a count from 1 to N after the finite state machine receives the initialization signal; and wherein the test controller is configured to perform the first operability test by generating the mismatch of each of the N bit pairs one at a time based on the count.

Example 7. The device of Examples 1 to 6 further wherein: each of the N XOR gates comprises a first XOR input to receive a first bit from the first input signal and a second XOR input to receive a second bit from the second input signal; and wherein the test controller further includes a binary decoder coupled with the binary counter, the binary decoder comprising N binary-counter outputs coupled with the second XOR input of the N XOR gates.

Example 8. The device of Examples 1 to 7 one or more additional comparators of claim 1, wherein the test controller is coupled with the first input port, the second input port, and the output port of each of the one or more additional comparators and is configured to perform the first operability test for each of the one or more additional comparators.

Example 9. A system including one or more devices of Examples 1 to 8, and further including an error-test controller disposed on the SOC and coupled with each test controller of the one or more devices and configured to deliver initialization signals to each test controller of the one or more devices to begin first operability tests and the error-test controller being configured to receive data signals from the test controllers communicating results of first operability tests.

Example 10. The system of Example 9, including a comparator collector coupled with the error-test controller and a plurality of devices of claim 1 wherein the comparator collector acts routes initialization signals, and data signals between the error-test controller and the test controller of the plurality of devices.

Example 11. A system for testing operation the comparator including: a first input port configured to receive N bits, a second input port configured to receive N bits, wherein the N bits of the second input port and the N bits of the first input port are split into N bit pairs, and an output port configured to produce an output signal having a first expected state when any of the N bit pairs are mismatched. The system further including a first circuit configured to produce a first signal comprising N bits; a second circuit configured to produce a second signal comprising N bits; a test controller configured to produce a test-enable signal; a selection circuit coupled to the first circuit, the second circuit, and the test controller, the selection circuit being configured to: pass the first signal to the first input port, and pass the second signal to the second input port when the test-enable signal is in a first state, and pass a first test signal from the test controller to the first input port, and pass a second test signal from the test controller to the second input port when the test-enable signal is in a second state; and wherein the test controller is configured to perform an operability test on the comparator by setting the test-enable signal to the second state and varying the first test signal, the second test signal, or both to mismatch the N bit pairs.

Example 12. The system of Example 11, wherein the selection circuit comprises a MUX.

Example 13. The system of Example 11 or 12, wherein the comparator is configured so the output signal includes a second expected state when all of the N bit pairs are matched; and wherein the test controller is configured to perform a second operability test on the comparator by setting the test-enable signal to the second state and matching the first test signal to the second test signal so all of the N bit pairs are matched.

Example 14. The system of Examples 11 to 13, wherein the comparator includes: an OR tree including an OR-tree output to produce an OR-tree output signal; and N XOR gates, each XOR gate receiving one of the N bit pairs and each XOR gate including an XOR output coupled to an input of the OR tree.

Example 15. The system of Examples 11 to 14, further comprising a gating circuit comprising: a gating-circuit input to receive the OR-tree output signal and the test-enable signal; a gating-circuit output to produce a gating-circuit output signal; and wherein the gating circuit is configured to set the gating-circuit output signal to the second expected state when the test-enable signal is set to the second state.

Example 16. The system of Examples 11 to 15, wherein the first circuit comprises a functional circuit and the second circuit comprises a redundancy-checker circuit.

Example 17. The system of Examples 11 to 16, wherein the system comprises a mission mode and wherein the test controller is configured to output an error signal when the test-enable signal comprises the second state while the system is in the mission mode.

Example 18. A method to test operations of a comparator on a system on a chip (SOC) comprising: receiving, by a test controller disposed on the SOC, an initialization signal; using the test controller to match a first signal received by the comparator with a second signal received by the comparator; checking that an output signal from the comparator comprises an expected output for matching inputs; using the test controller to mismatch the first signal received by the comparator and the second signal received by the comparator; and checking that the output signal comprises an expected output for mismatched inputs.

Example 19. The method of Example 18 further including, receiving, by the test controller, the output signal; and wherein the test controller is used to check that the output signal comprises the expected output for matching inputs and the test controller is used to check that the output signal comprises the expected output for mismatched inputs.

Example 20. The method of Example 18 or 19, further comprising determining, by the test controller, that the output signal does not comprise an expected output for mismatched inputs; and generating, by the test controller, an error signal.

Example 21. The method of Examples 18 to 20, wherein the first signal comprises N bits and the second signal comprises N bits; the method further comprises splitting the first signal and the second signal into N bit pairs, each bit pair comprising one bit from the first signal and one bit from the second signal; and wherein using the test controller to mismatch the first signal received by the comparator and the second signal received by the comparator comprises mismatching each bit pair one of the N bit pairs at a time.

Example 22. The method of Examples 18 to 21, further comprising asserting a test-enable signal by the test controller during test operations of the comparator on the SOC and generating an error signal, by the test controller, when the test-enable signal is asserted when test operations are not being performed.

Example 23. The method of Examples 18 to 22, further comprising performing the check that the output signal from the comparator comprises the expected output for matching inputs during a startup of the SOC.

Example 24. A system for testing operation of comparators comprising: a plurality of comparators, each comparator comprising; a first input port configured to receive N bits; a second input port configured to receive N bits; wherein the N bits of the second input port and the N bits of the first input port are split into N bit pairs; an output port configured to produce an output signal having a first expected state when any of the N bit pairs are mismatched. The system further including a first circuit configured to deliver a first signal comprising N bits to the first input port of each comparator of the plurality of comparators; a second circuit configured to deliver a second signal to the second input port of each comparator of the plurality of comparators; and wherein a test controller is configured to perform an operability test by instructing the first circuit, the second circuit, or both to mismatch the N bit pairs of each comparator of the plurality of comparators.

Example 25. The system for testing operation of comparators of Example 24, wherein the test controller performs the operability test by instructing the first circuit, the second circuit, or both to mismatch one bit pair of the N bit pairs at a time per comparator of the plurality of comparators.

Example 26. The system for testing operation of comparators of Example 24 or 25, further comprising a gating circuit that inputs the output signal of each comparator of the plurality of comparators.

Example 27. The system for testing operation of comparators of Examples 24 to 26, wherein the test controller is coupled with an output of the gating circuit and the test controller is configured to generate a test-fail signal when the output of the gating circuit deviates from an expected output during the operability test.

Example 28. The system for testing operation of comparators of Examples 24 to 27, wherein the first circuit comprises a memory error table and the second circuit comprises a new error buffer circuit.

Unless otherwise indicated or evident from the context of this disclosure, parts depicted in drawings with the same number may comprise the same devices.

The references used herein are provided merely for convenience and hence do not define the extent of protection or the scope of the embodiments.

References to illustrative embodiments in this description are not intended to be construed in a limiting sense. Various modifications and combinations of the illustrative embodiments, as well as other embodiments will be apparent to persons skilled in the art upon reference to the description. It is therefore intended that the appended claims encompass any such modifications or embodiments.

What is claimed is:

1. A built-in self-test device for a system on a chip (SOC), the built-in self-test device comprising:
   a comparator disposed on the SOC and comprising;
      a first input port to receive a first input signal;
      a second input port to receive a second input signal;
      an output port to produce an output signal;
      wherein the first input signal and the second input signal are split into N bit pairs each bit pair comprising one bit from the first input signal and one bit from the second input signal; and
      wherein the comparator is configured so a mismatch between the first input signal and the second input signal causes the output signal to comprise a first expected state; and
   a test controller disposed on the SOC and coupled with the first input port, the second input port, and the output port, the test controller being configured to perform a first operability test by generating a mismatch for each of the N bit pairs and verifying that the output signal comprises the first expected state in response to the mismatch for each of the N bit pairs.

2. The device of claim 1, wherein the test controller is configured to mismatch the N bit pairs one at a time.

3. The device of claim 1, wherein the comparator is configured so a match between the first input signal and the second input signal causes the output signal to comprise a second expected state; and
   the test controller is configured to perform a second operability test by matching the N bit pairs and verifying that the output signal comprises the second expected state.

4. The device of claim 1, wherein the comparator comprises:
   an OR tree comprising an OR-tree output to produce an OR-tree output signal; and
   N XOR gates, each XOR gate receiving one of the N bit pairs and each XOR gate comprising an XOR output coupled to an input of the OR tree.

5. The device of claim 4, wherein the test controller is configured to: receive an initialization signal to initialize the first operability test; output a test-complete signal; and output a test-result signal.

6. The device of claim 5, further wherein:
   the test controller comprises:
      a finite state machine that receives the initialization signal;
      a binary counter that is in communication with the finite state machine and configured to initialize a count from 1 to N after the finite state machine receives the initialization signal; and
      wherein the test controller is configured to perform the first operability test by generating the mismatch of each of the N bit pairs one at a time based on the count.

7. The device of claim 6, further wherein:
   each of the N XOR gates comprises a first XOR input to receive a first bit from the first input signal and a second XOR input to receive a second bit from the second input signal; and
   wherein the test controller further comprises a binary decoder coupled with the binary counter, the binary decoder comprising N binary-counter outputs coupled with the second XOR input of the N XOR gates.

8. The device of claim 1, further comprising one or more additional comparators of claim 1, wherein the test controller is coupled with the first input port, the second input port, and the output port of each of the one or more additional comparators and is configured to perform the first operability test for each of the one or more additional comparators.

9. A system comprising one or more devices of claim 1, and further comprising an error-test controller disposed on the SOC and coupled with each test controller of the one or more devices and configured to deliver initialization signals to each test controller of the one or more devices to begin first operability tests and the error-test controller being configured to receive data signals from the test controllers communicating results of first operability tests.

10. The system of claim 9, comprising a comparator collector coupled with the error-test controller and a plurality of devices of claim 1 wherein the comparator collector acts routes initialization signals, and data signals between the error-test controller and the test controller of the plurality of devices.

11. A system for testing operation of a comparator comprising:
    the comparator comprising:
       a first input port configured to receive N bits,
       a second input port configured to receive N bits,
       wherein the N bits of the second input port and the N bits of the first input port are split into N bit pairs, and
       an output port configured to produce an output signal having a first expected state when any of the N bit pairs are mismatched;
    a first circuit configured to produce a first signal comprising N bits;
    a second circuit configured to produce a second signal comprising N bits;
    a test controller configured to produce a test-enable signal;
    a selection circuit coupled to the first circuit, the second circuit, and the test controller, the selection circuit being configured to:
       pass the first signal to the first input port, and pass the second signal to the second input port when the test-enable signal is in a first state, and
       pass a first test signal from the test controller to the first input port, and pass a second test signal from the test controller to the second input port when the test-enable signal is in a second state; and
    wherein the test controller is configured to perform an operability test on the comparator by setting the test-enable signal to the second state and varying the first test signal, the second test signal, or both to mismatch the N bit pairs.

12. The system of claim 11, wherein the selection circuit comprises a MUX.

13. The system of claim 11, wherein the comparator is configured so the output signal comprises a second expected state when all of the N bit pairs are matched; and
    wherein the test controller is configured to perform a second operability test on the comparator by setting the test-enable signal to the second state and matching the first test signal to the second test signal so all of the N bit pairs are matched.

14. The system of claim 13, wherein the comparator comprises:
   an OR tree comprising an OR-tree output to produce an OR-tree output signal; and
   N XOR gates, each XOR gate receiving one of the N bit pairs and each XOR gate comprising an XOR output coupled to an input of the OR tree.

15. The system of claim 14, further comprising a gating circuit comprising:
   a gating-circuit input to receive the OR-tree output signal and the test-enable signal;
   a gating-circuit output to produce a gating-circuit output signal; and
   wherein the gating circuit is configured to set the gating-circuit output signal to the second expected state when the test-enable signal is set to the second state.

16. The system of claim 11, wherein the first circuit comprises a functional circuit and the second circuit comprises a redundancy-checker circuit.

17. The system of claim 11, wherein the system comprises a mission mode and wherein the test controller is configured to output an error signal when the test-enable signal comprises the second state while the system is in the mission mode.

18. A method to test operations of a comparator on a system on a chip (SOC) comprising:
   receiving, by a test controller disposed on the SOC, an initialization signal;
   using the test controller to match a first signal received by the comparator with a second signal received by the comparator;
   checking that an output signal from the comparator comprises an expected output for matching inputs;
   using the test controller to mismatch the first signal received by the comparator and the second signal received by the comparator; and
   checking that the output signal comprises an expected output for mismatched inputs.

19. The method of claim 18, receiving, by the test controller, the output signal; and wherein the test controller is used to check that the output signal comprises the expected output for matching inputs and the test controller is used to check that the output signal comprises the expected output for mismatched inputs.

20. The method of claim 19, further comprising determining, by the test controller, that the output signal does not comprise an expected output for mismatched inputs; and
   generating, by the test controller, an error signal.

21. The method of claim 19, wherein the first signal comprises N bits and the second signal comprises N bits; the method further comprises splitting the first signal and the second signal into N bit pairs, each bit pair comprising one bit from the first signal and one bit from the second signal; and wherein using the test controller to mismatch the first signal received by the comparator and the second signal received by the comparator comprises mismatching each bit pair one of the N bit pairs at a time.

22. The method of claim 18, further comprising asserting a test-enable signal by the test controller during test operations of the comparator on the SOC and generating an error signal, by the test controller, when the test-enable signal is asserted when test operations are not being performed.

23. The method of claim 18, further comprising performing the check that the output signal from the comparator comprises the expected output for matching inputs during a startup of the SOC.

24. A system for testing operation of comparators comprising:
   a plurality of comparators, each comparator comprising:
      a first input port configured to receive N bits;
      a second input port configured to receive N bits;
      wherein the N bits of the second input port and the N bits of the first input port are split into N bit pairs; and
      an output port configured to produce an output signal having a first expected state when any of the N bit pairs are mismatched;
   a first circuit configured to deliver a first signal comprising N bits to the first input port of each comparator of the plurality of comparators;
   a second circuit configured to deliver a second signal to the second input port of each comparator of the plurality of comparators; and
   wherein a test controller is configured to perform an operability test by instructing the first circuit, the second circuit, or both to mismatch the N bit pairs of each comparator of the plurality of comparators.

25. The system for testing operation of comparators of claim 24, wherein the test controller performs the operability test by instructing the first circuit, the second circuit, or both to mismatch one bit pair of the N bit pairs at a time per comparator of the plurality of comparators.

26. The system for testing operation of comparators of claim 25, further comprising a gating circuit that inputs the output signal of each comparator of the plurality of comparators.

27. The system for testing operation of comparators of claim 26, wherein the test controller is coupled with an output of the gating circuit and the test controller is configured to generate a test-fail signal when the output of the gating circuit deviates from an expected output during the operability test.

28. The system for testing operation of comparators of claim 27, wherein the first circuit comprises a memory error table and the second circuit comprises a new error buffer circuit.

* * * * *